United States Patent
Kuroki et al.

(10) Patent No.: US 10,305,063 B2
(45) Date of Patent: May 28, 2019

(54) TRANSPARENT ORGANIC ELECTROLUMINESCENCE ELEMENT

(71) Applicant: Konica Minolta, Inc., Tokyo (JP)

(72) Inventors: Takaaki Kuroki, Hachioji (JP); Takatoshi Suematsu, Tokyo (JP); Shigeru Kojima, Hino (JP); Shusaku Kon, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/745,262

(22) PCT Filed: Aug. 25, 2016

(86) PCT No.: PCT/JP2016/074737
§ 371 (c)(1),
(2) Date: Jan. 16, 2018

(87) PCT Pub. No.: WO2017/056797
PCT Pub. Date: Apr. 6, 2017

(65) Prior Publication Data
US 2019/0006614 A1    Jan. 3, 2019

(30) Foreign Application Priority Data
Sep. 30, 2015 (JP) ................. 2015-192635

(51) Int. Cl.
*H01L 51/50* (2006.01)
*H01L 51/52* (2006.01)
(Continued)

(52) U.S. Cl.
CPC .......... *H01L 51/5212* (2013.01); *H01L 51/50* (2013.01); *H05B 33/02* (2013.01);
(Continued)

(58) Field of Classification Search
None
See application file for complete search history.

(56) References Cited

U.S. PATENT DOCUMENTS

| | | |
|---|---|---|
| 6,452,218 B1 * | 9/2002 | Cao ............... H01L 51/5221 257/103 |
| 7,863,809 B2 * | 1/2011 | Sera .............. H01L 51/524 313/504 |

(Continued)

FOREIGN PATENT DOCUMENTS

| | | |
|---|---|---|
| JP | 2009301754 A | 12/2009 |
| JP | 2012014859 A | 1/2012 |

(Continued)

OTHER PUBLICATIONS

Ho, Yoon, et al. "Characteristics of Dual Emission Using a Thin Semi-Transparent Au Cathode for Organic Light-Emitting Devices." Journal of the Korean Physical Society, vol. 50, No. 2, 2007, p. 519., doi:10.3938/jkps.50.519.*

(Continued)

*Primary Examiner* — J. E. Schoenholtz
(74) *Attorney, Agent, or Firm* — Lucas & Mercanti, LLP

(57) ABSTRACT

An object of the present invention is to provide a transparent organic electroluminescence element in which durability is excellent, a transparent lead-out electrode of low resistance is provided, and there is no uncomfortable feeling in visibility of the entire element. The transparent organic electroluminescence element according to the present invention is a transparent organic electroluminescence element including: at least an organic electroluminescence element portion and a lead-out electrode portion, in which two-sided light emission is capable of being performed, wherein a total light transmittance (%) of the lead-out electrode portion in a visible light range is in a range of 90% to 110%, with respect (Continued)

to a total light transmittance (%) of the organic electroluminescence element portion in a visible light range at the time of non-light emission.

20 Claims, 3 Drawing Sheets

(51) Int. Cl.
    *H05B 33/02*     (2006.01)
    *H05B 33/04*     (2006.01)
    *H05B 33/06*     (2006.01)
    *H05B 33/12*     (2006.01)

(52) U.S. Cl.
    CPC ............ *H05B 33/04* (2013.01); *H05B 33/06* (2013.01); *H05B 33/12* (2013.01)

(56) References Cited

U.S. PATENT DOCUMENTS

| | | | | |
|---|---|---|---|---|
| 8,274,216 | B2* | 9/2012 | Furukawa | C09K 11/06 257/40 |
| 2009/0102366 | A1* | 4/2009 | Ushikubo | C09K 11/06 313/504 |
| 2011/0260154 | A1* | 10/2011 | Furukawa | C09K 11/06 257/40 |
| 2015/0064628 | A1* | 3/2015 | Guo | G03F 7/30 430/316 |
| 2015/0333287 | A1* | 11/2015 | Sawabe | H01L 51/5203 315/294 |

FOREIGN PATENT DOCUMENTS

| | | |
|---|---|---|
| JP | 2013004245 A | 1/2013 |
| JP | 2014154212 A | 8/2014 |
| JP | 2015115191 A | 6/2015 |

OTHER PUBLICATIONS

Ok, Ki-Hun, et al. "Ultra-Thin and Smooth Transparent Electrode for Flexible and Leakage-Free Organic Light-Emitting Diodes." Scientific Reports, vol. 5, No. 1, 2015, doi:10.1038/srep09464.*

Park, Sunghee, et al. "Efficient Large-Area Transparent OLEDs Based on a Laminated Top Electrode with an Embedded Auxiliary Mesh." ACS Photonics, vol. 4, No. 5, 2017, pp. 1114-1122., doi:10.1021/acsphotonics.6b00942.*

International Search Report dated Nov. 29, 2016 from corresponding International Application No. PCT/JP2016/074737 and English translation.

Written Opinion Opinion of the International Searching Authority dated Nov. 29, 2016 from corresponding International Application No. PCT/JP2016/074737 and English translation.

* cited by examiner

TRANSPARENT ORGANIC ELECTROLUMINESCENCE ELEMENT

CROSS REFERENCE TO RELATED APPLICATION

This Application is a 371 of PCT/JP2016/074737 filed on Aug. 25, 2016 which, in turn, claimed the priority of Japanese Application No. 2015-192635 filed on Sep. 30, 2015, both applications are incorporated herein by reference.

TECHNICAL FIELD

The present invention relates to a transparent organic electroluminescence element. More specifically, the present invention relates to a transparent organic electroluminescence element in which durability is excellent, a transparent lead-out electrode of low resistance is provided, and there is no uncomfortable feeling in visibility of the entire element.

BACKGROUND ART

Currently, a light emitting element using an electroluminescence (EL) of an organic material has attracted attention, as a thin light emitting device.

A so-called organic electroluminescence element (hereinafter, also referred to as an organic EL element) is a thin film type complete solid element in which light can be emitted at a low voltage of approximately several V to several dozen V, has various excellent characteristics such as a high brightness, a high light emitting efficiency, thinness, and lightness. For this reason, recently, the organic electroluminescence element has attracted attention as backlights of various displays, a display plate of a signboard, an emergency light, or the like, a surface light emitting body of an illumination light source or the like.

Such an organic EL element has a configuration in which a light emitting layer formed of an organic material is disposed between two facing electrodes, and emission light generated by the light emitting layer is transmitted through the electrode, and is led out to the outside. For this reason, at least one of two electrodes is configured as a transparent electrode, and the emission light is led out from the transparent electrode side.

On the other hand, a demand for a substantially transparent organic EL element in which two-sided light emission can be performed, increases from the viewpoint of a height of tiling or designability.

In Patent Literature 1, an organic EL element, in which a negative electrode (also referred to as a cathode) is formed of a thin silver film in addition to a transparent positive electrode of the related art (also referred to as an anode) using indium tin oxide (ITO) or the like, and thus, a transparence is improved, and emission light from two sides can be led out, is reported as the organic EL element in which two-sided light emission can be performed. According to such a technology, in a general organic EL element of the related art, it is possible to improve a light transmittance in a visible light range, which is less than 40%, to a light transmittance of greater than or equal to 50%, but a demand for a transparent organic EL element is high.

On the other hand, a demand for tiling a plurality of transparent organic EL elements also increases, but a functional member of a sealing/lead-out electrode or the like is disposed around the light emitting unit, and in general, such a portion has an intrinsic light transmittance, and thus, has transparency which is completely different from that of the transparent organic EL element. For example, in a case of using a metal film such as an MAM electrode (Mo/Al.Nd Alloy/Mo) of the related art, the MAM electrode has low light transmissive properties, and thus, the electrode portion is viewed, and there is uncomfortable feeling in visibility of the entire element. In addition, in a case of using an electrode of a high transparence, such as ITO, as the lead-out electrode, a difference in the transparence with respect to the organic EL element is large, and thus, in reverse, such a portion becomes a direct transmission portion, and according to this, there is also uncomfortable feeling in the visibility, conductivity is low in ITO, and a voltage drop occurs.

In addition, in Patent Literature 2, a technology is disclosed in which an auxiliary electrode using a transparent electrode and a thin metal line is superimposed, and thus, electric resistance decreases, and a moisture penetration inhibitor is used at the time of leading out the auxiliary electrode, but the thin metal line portion has a structure in which the thin metal line portion is drawn out to the outside of a sealing material, and thus, there is a problem in durability, and in the known technology, technological thought of controlling the transparency of the lead-out electrode is not disclosed at all.

Therefore, a demand for a transparent organic EL element including a transparent lead-out electrode, in which durability is excellent, low resistance is obtained, and there is no uncomfortable feeling in visibility of the entire element, is high.

CITATION LIST

Patent Literature

Patent Literature 1: JP 2013-04245 A
Patent Literature 2: JP 2015-115191 A

SUMMARY OF INVENTION

Technical Problem

The present invention has been made in consideration of the problems and circumstances described above, and an object thereof is to provide a transparent organic electroluminescence element in which durability is excellent, a transparent lead-out electrode of low resistance is provided, and there is no uncomfortable feeling in visibility of the entire element.

Solution to Problem

In the process of considering the cause of the problems described above in order to solve the problems described above, the present inventors have found that in a transparent organic electroluminescence element, including; at least an organic electroluminescence element portion and a lead-out electrode portion in which two-sided light emission can be performed, a total light transmittance (%) of the lead-out electrode portion in a visible light range is in a specific range with respect to a total light transmittance (%) of the organic electroluminescence element portion in a visible light range at the time of non-light emission, and thus, it is possible to obtain a transparent organic electroluminescence element in which a durability is excellent, a transparent lead-out electrode of low resistance is provided, and there is no uncomfortable feeling in visibility of the entire element.

That is, the object of the present invention can be attained by the following means.

1. A transparent organic electroluminescence element, including: at least an organic electroluminescence element portion and a lead-out electrode portion, in which two-sided light emission is capable of being performed, wherein a total light transmittance (%) of the lead-out electrode portion in a visible light range is in a range of 90% to 110%, with respect to a total light transmittance (%) of the organic electroluminescence element portion in a visible light range at the time of non-light emission.

2. The transparent organic electroluminescence element according to Item. 1, wherein a surface resistance value of the lead-out electrode portion is less than 3 Ω/square.

3. The transparent organic electroluminescence element according to Item. 1 or 2, wherein the organic electroluminescence element portion is provided on a film base material.

4. The transparent organic electroluminescence element according to any one of Items. 1 to 3, wherein the lead-out electrode portion includes at least a thin metal line.

5. The transparent organic electroluminescence element according to any one of Items. 1 to 4, wherein the lead-out electrode portion includes at least a thin metal line and a metal oxide layer.

6. The transparent organic electroluminescence element according to Item. 4 or 5, wherein a line width of the thin metal line is less than or equal to 30 μm.

7. The transparent organic electroluminescence element according to any one of Items. 4 to 6, wherein a pattern shape of the thin metal line has a polarization suppressing structure.

8. The transparent organic electroluminescence element according to any one of Items. 1 to 7, wherein the lead-out electrode portion exists only in a sealing region, and the lead-out electrode portion is connected to a second lead-out electrode having a planar structure in a pass portion inside and outside the sealing region.

Advantageous Effects of Invention

According to the means of the present invention, it is possible to provide an organic electroluminescence element in which a durability is excellent, a transparent lead-out electrode of low resistance is provided, and there is no uncomfortable feeling in visibility of the entire element.

An expression mechanism to an action mechanism of the effect of the present invention are assumed as follows.

A transparence of the lead-out electrode portion electrically connecting a positive electrode (also referred to as an anode) and a negative electrode (also referred to as a cathode) of the organic electroluminescence element and an external power source together is also a problem. In a case of using a metal film such as an MAM electrode (Mo/Al.Nd Alloy/Mo) as a known lead-out electrode portion of the related art, the MAM electrode has low light transmissive properties, and thus, the electrode portion is viewed, and there is uncomfortable feeling in visibility of the entire element. In addition, in a case of using an electrode of a high transparence, such as ITO, as the lead-out electrode portion, a difference in the transparence with respect to the organic EL element is large, and thus, in reverse, such a portion becomes a direct transmission portion, and according to this, there is also uncomfortable feeling in the visibility.

A relationship between the transparences of the lead-out electrode portion and the organic electroluminescence element portion according to the present invention is adjusted to be in a specific range of a light transmittance, and thus, the transparent organic electroluminescence element is obtained in which there is no uncomfortable feeling in the transparence, and the visibility is excellent.

On the other hand, it is assumed that in a case of using a thin metal line in order to improve the transparence of the lead-out electrode portion, there is a case where moire due to polarization occurs according to a pattern shape of the thin metal line at the time of observing the organic electroluminescence element, but as with the present invention, the pattern shape of the thin metal line is adjusted to a polarization suppressing structure, and thus, it is possible to obtain the transparent organic electroluminescence element in which the occurrence of polarized light is suppressed, moire or the like is not observed, and the visibility is improved.

DESCRIPTION OF EMBODIMENTS

Figure 1:
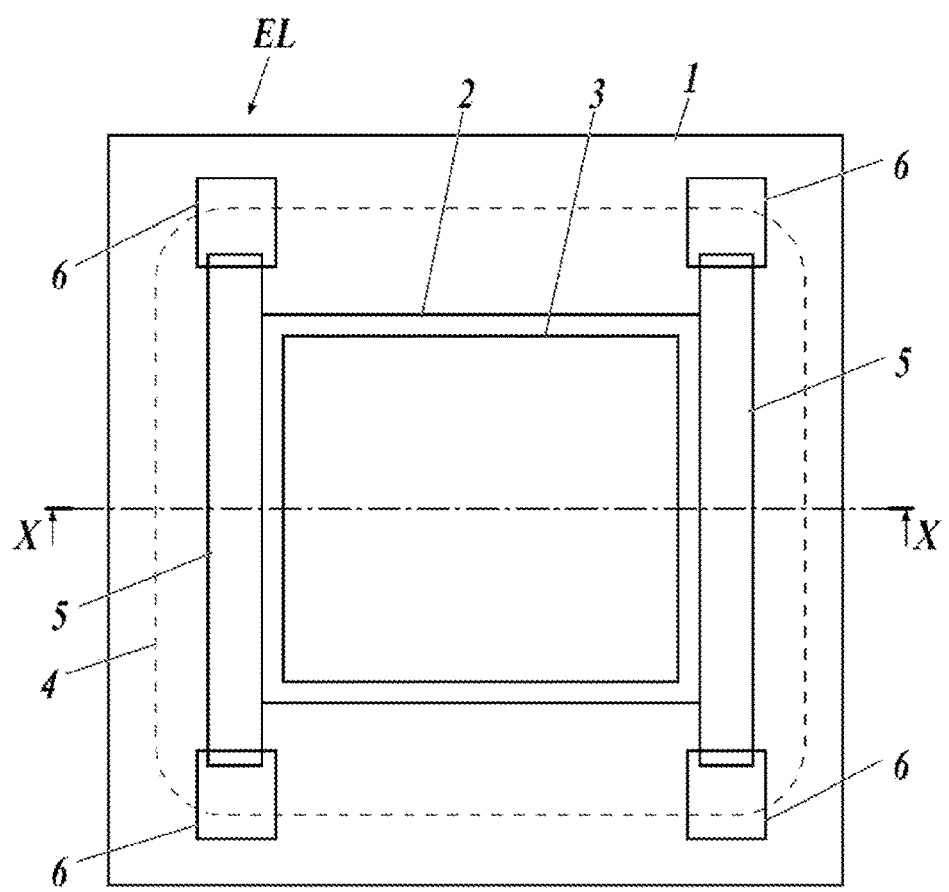
FIG. 1 is a plan view of a transparent organic EL element of the present invention.

A transparent organic electroluminescence element of the present invention, includes: at least an organic electroluminescence element portion and a lead-out electrode portion, in which two-sided light emission can be performed, and a total light transmittance (%) of the lead-out electrode portion in a visible light range is in a range of 90% to 110% with respect to a total light transmittance (%) of the organic electroluminescence element portion in a visible light range at the time of non-light emission. Such characteristics are technical characteristics which are common in the present invention according to each claim.

From the viewpoint of expressing the effect of the present invention, in an aspect of the present invention, it is preferable that a surface resistance value of the lead-out electrode portion is less than 3 Ω/square, from the viewpoint of suppressing a voltage drop of the element by an electrode of low resistance.

In addition, it is preferable that the organic electroluminescence element portion is provided on a film base material, from the viewpoint of applying flexibility to the element.

In addition, it is preferable that the lead-out electrode portion includes at least a thin metal line as the electrode, from the viewpoint of suppressing a voltage drop by the electrode of low resistance, and of ensuring transparency.

It is preferable that the lead-out electrode portion includes a thin metal line and a metal oxide layer is a preferred aspect from the viewpoint of obtaining the electrode of low resistance, and an aspect in which a line width of the thin metal line is less than or equal to 30 μm, is a preferred aspect from the viewpoint of improving the transparency.

In addition, an aspect in which a pattern shape of the thin metal line has a polarization suppressing structure, is a preferred aspect from the viewpoint of improving visibility without occurring moire or the like.

Further, an aspect in which the lead-out electrode portion exists only in a sealing region, and the lead-out electrode portion is connected to a second lead-out electrode portion having a planar structure in a pass portion inside and outside the sealing region, is a preferred aspect from the viewpoint of improving adhesiveness between the sealing layer and the electrode, and of improving the visibility of the organic electroluminescence element.

Hereinafter, the present invention and constituents thereof, and embodiments and aspects of the present invention will be described in detail. Furthermore, herein, "to" is used as the meaning including numerical values described before and after "to" as a lower limit value and an upper limit value.

<<Outline of Transparent Organic Electroluminescence Element of Present Invention>>

A transparent organic electroluminescence element (hereinafter, also referred to as an organic EL element) of the present invention, includes: at least an organic electroluminescence element portion and a lead-out electrode portion, in which two-sided light emission can be performed, and a total light transmittance (%) of the lead-out electrode portion in a visible light range is in a range of 90% to 110% with respect to a total light transmittance (%) of the organic electroluminescence element portion in a visible light range at the time of non-light emission.

The "organic electroluminescence element portion", which is a measurement target of the total light transmittance in the visible light range according to the present invention, indicates an element in which a positive electrode, a first carrier functional layer group, a light emitting layer, a second carrier functional layer group, a negative electrode, and a sealing base material are laminated as a minimum configuration. The first carrier functional layer group, for example, is configured of a hole injecting layer, a hole transporting layer, an electron inhibiting layer, and the like, and the second carrier functional layer group, for example, is configured of a hole inhibiting layer, an electron transporting layer, an electron injecting layer, and the like.

Here, the visible light range indicates a range of a light wavelength of 400 nm to 700 nm. The total light transmittance (%), for example, is a value which is obtained by measuring a total light transmittance (%) in a range of a light wavelength of 400 nm to 700 nm according to a method described in JIS K 7361-1:1997 (a test method of a total light transmittance of plastic-transparent material) by using a spectrophotometer (U-3300, manufactured by Hitachi High-Technologies Corporation), and by value averaging the measured value. In the present invention, "transparent" indicates that the total light transmittance (%) is greater than or equal to 30%, is preferably greater than or equal to 40%, is more preferably greater than or equal to 50%, is even more preferably greater than or equal to 60%, and is particularly preferably greater than or equal to 70%.

The organic EL element portion and the lead-out electrode portion according to the present invention will be described on the basis of the drawings.

FIG. 1 is a plan view of the transparent organic EL element of the present invention. In FIG. 1, the "organic EL element portion" according to the present invention indicates all of an organic functional layer 2, and a positive electrode and a negative electrode (not illustrated) which are formed to interpose the organic functional layer 2 therebetween, and the "lead-out electrode portion" according to the present invention indicates a first lead-out electrode portion 5.

In the transparent organic EL element (EL) of the present invention, the organic functional layer 2 is formed on a transparent base material 1, the first lead-out electrode portion 5 is connected to the positive electrode and the negative electrode (not illustrated) which are formed to be adjacent to each other to interpose the organic functional layer 2 therebetween. A sealing region 4 completely sealing the organic functional layer 2 and the first lead-out electrode portion 5 including a light emitting region 3 with a sealing material, is formed. The first lead-out electrode portion 5 is connected to a second lead-out electrode portion 6 having a planar structure in a pass portion inside and outside the sealing region 4. The second lead-out electrode portion 6 is a portion responsible for connection between the inside and the outside of the sealing, and it is preferable to have a high film density/a low moisture vapor permeability, and to have a minimized area.

Figure 2:
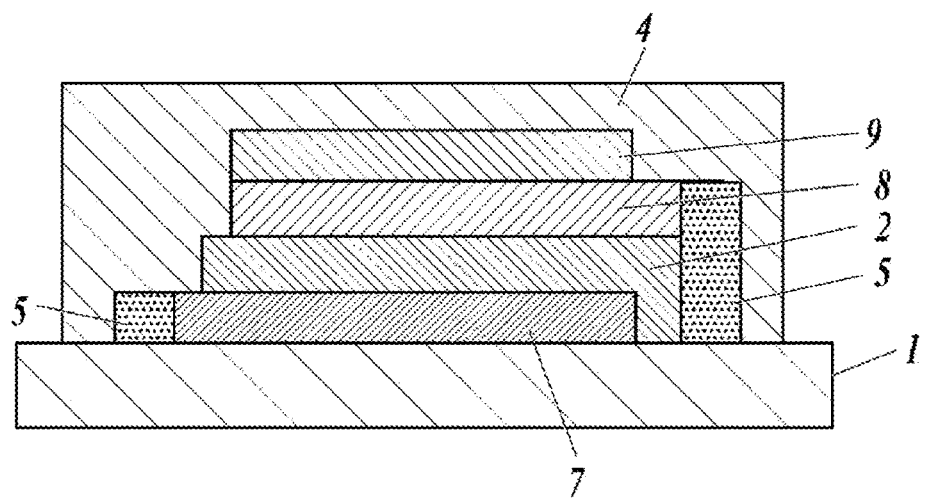
FIG. 2 is a sectional view of the transparent organic EL element of the present invention.

FIG. 2 is a sectional view of the transparent organic EL element along line X-X of FIG. 1.

In the transparent organic EL element (EL) of the present invention, a positive electrode 7, the organic functional layer 2, and a negative electrode 8 are formed on the transparent base material 1 in this order, and the first lead-out electrode portion 5 is connected to the positive electrode 7 and the negative electrode 8. The positive electrode 7, the organic functional layer 2, the negative electrode 8, and the first lead-out electrode portion 5 are completely in the sealing region 4. Furthermore, as necessary, a functional layer such as an antistatic layer may be formed on a rear surface of the transparent base material 1, or a functional layer such as an optical adjustment layer 9 may be formed on the negative electrode 8.

Figure 3:
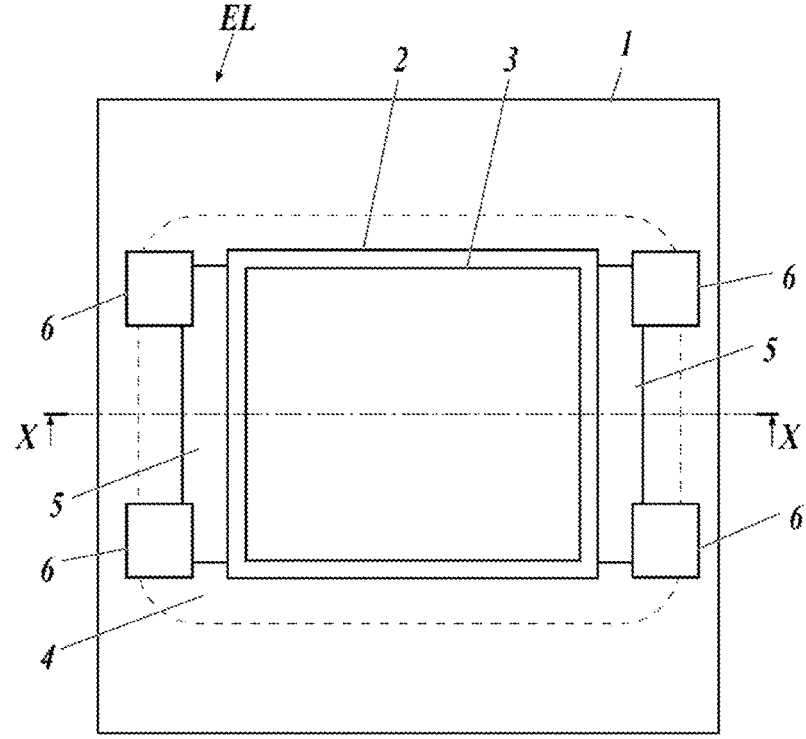
FIG. 3 is a plan view illustrating a modification example of the transparent organic EL element of the present invention.
Figure 4:
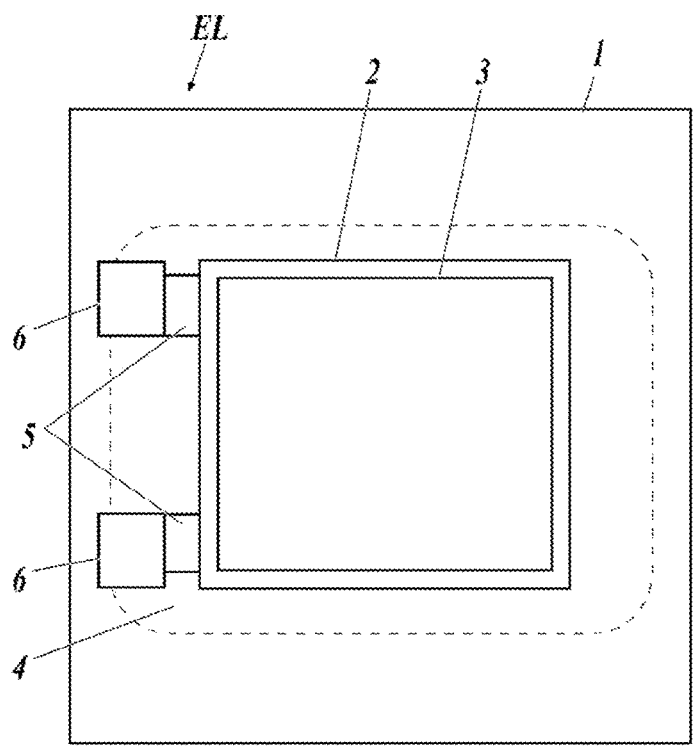
FIG. 4 is a plan view illustrating a modification example of the transparent organic EL element of the present invention.

FIG. 3 and FIG. 4 are plan views illustrating a modification example of the transparent organic EL element of the present invention.

In FIG. 3, the first lead-out electrode portion 5 is disposed to have the same width as that of the light emitting region 3, and the first lead-out electrode portion 5 is connected to the positive electrode and the negative electrode (not illustrated).

In FIG. 4, the first lead-out electrode portion 5 is disposed on one side, and the first lead-out electrode portion 5 is connected to the positive electrode and the negative electrode (not illustrated). In both cases, the sealing region 4 completely sealing the first lead-out electrode portion 5 with the sealing material is formed, and the first lead-out electrode portion 5 is connected to the second lead-out electrode portion 6 having a planar structure in the pass portion inside and outside the sealing region 4.

It is preferable to have such a structure, since an area of a light emitting region easily increases without interposing the lead-out electrode at the time of tiling a plurality of elements.

In the configuration of FIG. 3, an elongated panel can be formed by tiling a plurality of elements in an up-and-down direction. Such elongated panels are arranged in a horizontal direction, and thus, a transparent partition can be formed.

[1] Lead-out Electrode Portion

In the present invention, the "lead-out electrode portion" is a portion in which a transparent positive electrode (an anode), a transparent negative electrode (a cathode), and an external power source are electrically connected to each other, and is also referred to as a "draw-out electrode portion". In a case of using an MAM electrode (Mo/Al.Nd Alloy/Mo) or the like of the related art as a metal film of the lead-out electrode portion, the MAM electrode has low light transmissive properties, and thus, in the organic EL element portion, the electrode portion is viewed, a variation occurs in a transparence of the organic EL the entire element, and there is uncomfortable feeling in visibility. In addition, in a case of using an electrode of a high transparence, such as ITO, as the lead-out electrode, a difference in the transparence with respect to the organic EL element portion is large, and thus, in reverse, such a portion becomes a direct transmission portion, and according to this, there is also uncomfortable feeling in the visibility.

In the present invention, the total light transmittance (%) of the lead-out electrode portion in the visible light range is in a range of 90% to 110% of the total light transmittance (%) of the organic EL element portion at the time of non-light emission. The total light transmittance (%) of the lead-out electrode portion in the visible light range is more preferably in a range of 95% to 105%, and is even more preferably in a range of 98% to 102%.

The lead-out electrode portion according to the present invention can be selected from electrodes using a thin metal line (also referred to as a grid) such as a combination of a metal thin film layer, a metal oxide layer, a thin metal line, and a metal oxide layer, and a combination of a thin metal line and a metal thin film layer, and a combination of a thin metal line and a conductive polymer layer, and a conductive layer, and it is preferable to adopt an electrode using a thin metal line from the viewpoint of low resistance.

[1.1] Lead-out Electrode Portion Using Thin Metal Line

It is preferable that the lead-out electrode portion according to the present invention is selected from electrodes using a thin metal line (also referred to as a grid) such as a combination of a thin metal line and a metal oxide layer, a combination of a thin metal line and a conductive polymer layer, and a combination of a thin metal line and a metal thin film layer, from the viewpoint of the transparency and low resistance. Among them, the combination of the thin metal line and the metal oxide layer is preferable from the viewpoint of further improving the transparency and low resistance. Hereinafter, the lead-out electrode portion using the thin metal line will be described in detail.

[1.1.1] Thin Metal Line

A thin metal line pattern configuring the lead-out electrode portion is formed by containing a metal as a main component at a content ratio of the metal to the extent of being capable of obtaining conductivity. A ratio of the metal in the thin metal line pattern is preferably greater than or equal to 50 mass %.

A surface resistance value of the lead-out electrode portion including the thin metal line, is preferably less than or equal to 100 Ω/square, is more preferably less than or equal to 10 Ω/square, and is even more preferably less than or equal to 3 Ω/square. The surface specific resistance, for example, can be measured on the basis of JIS K6911, ASTM D257, or the like, and can be simply measured by using a commercially available surface resistivity meter.

The thin metal line pattern configuring the lead-out electrode portion contains a metal material, and for example, is formed on the resin base material, which is a transparent base material, in the shape of a pattern to include an opening portion. In a case of using the transparent base material, the opening portion is a portion not including the thin metal line pattern, and is a light transmissive portion of the thin metal line pattern. For example, an opening rate of a stripe-like pattern with a line width of 100 μm and a line interval of 1 mm is approximately 90%.

A pattern shape of the thin metal line pattern is not particularly limited. Examples of the pattern shape of the thin metal line pattern include shapes of a stripe (a parallel line), a grid, a honeycomb, a random reticulation, and the like, and there is a case where moire due to polarization occurs according to a pattern shape of a fine line, and thus, the shapes of the grid and the honeycomb are more preferable from the viewpoint of the transparency and of suppressing polarization properties. Among them, a hexaradial shape (a grid of *) and an octaradial shape (a combined grid of + and ×) are more preferable, and the hexaradial shape (the grid of *) and the octaradial shape (the combined grid of + and ×) are particularly preferable.

In addition, in a case of using a transparent substrate, it is necessary to optimally design a ratio of the opening portion, that is, the opening rate from the viewpoint of the transparency. The characteristics of the present application are that the transmittance of the lead-out electrode is matched to the transmittance of the transparent organic EL element, and such control can be adjusted at the opening rate. That is, the transmittance of the lead-out electrode can be easily adjusted by a combination of the opening rate which is formed by the thin metal line pattern (in general, also referred to as Grid) and a transmittance of a surface electrode such as a metal oxide.

It is preferable that the total light transmittance of the lead-out electrode portion of the present invention is adjusted at the opening rate. In a case of not using a thin metal line pattern electrode, it is possible to adjust the transmittance as described above according to a combination of a metal thin film electrode having large absorbency and a metal oxide electrode having small absorbency. Such a method is one preferred aspect in which moire or the like, which is the problem of the thin metal line pattern electrode, does not occur.

A line width of the thin metal line pattern is preferably in a range of 10 μm to 200 μm, is more preferably in a range of 10 μm to 100 μm, and is particularly preferably in a range of 10 μm to 30 μm. In a case where the line width of the thin metal line pattern is greater than or equal to 10 μm, desired conductivity is obtained, and in a case where the line width of the thin metal line pattern is less than or equal to 200 μm, electrode transparency is improved. In order to decrease the visibility of the fine line pattern of the lead-out electrode portion, it is preferable to decrease the total width, and in particular, in a case where the line width of the thin metal line pattern is less than 30 μm, the visibility of the fine line pattern sufficiently decreases, and thus, the transparency is excellent.

In a stripe-like pattern and a grid-like pattern, it is preferable that an interval between the thin metal line patterns is in a range of 0.5 mm to 4 mm. In general, in a case where the line width is thick, the interval is wide, and in a case where the line width is thin, the interval is narrow, and thus, it is preferable to use the thin metal line pattern by adjusting the total opening rate, and in a case where the lines are arranged with a line width of less than or equal to 30 μm and an interval of less than 300 μm, a film having a homogeneous concentration can be felt at the time of being observed, without sensing a line.

A height (a thickness) of the thin metal line pattern is preferably in a range of 0.1 μm to 5.0 μm, and is more preferably in a range of 0.1 μm to 2.0 μm. In a case where the height of the thin metal line pattern is greater than or equal to 0.1 μm, desired conductivity is obtained, and in a case where the height of the thin metal line pattern is less than or equal to 5.0 μm, it is possible to reduce an influence of a unevenness difference on a layer thickness distribution of a functional layer in a case of being used in the organic EL element.

In the thin metal line pattern, it is preferable that a metal ink composition is prepared in which a metal or a forming material of the metal is blended, and a post-treatment such as a drying treatment or a calcining treatment is performed by being suitably selected after being applied, and thus, the thin metal line pattern is formed.

The metal (a single metal or an alloy) to be blended in the metal ink composition is preferably in the shape of particles or a fiber (a tube, a wire, or the like), and is more preferably in the shape of metal nanoparticles. In addition, it is preferable that the metal is formed of the forming material of the metal which has a metal atom (element), and generates a metal by a structural change such as decomposition. The metal or the forming material of the metal in the metal ink composition may be only one type of metal, or may be two or more types of metals, and in a case of two or more types of metals, a combination and a ratio thereof can be arbitrarily adjusted.

In the present invention, the metal nanoparticles indicate a metal or a metal oxide in the shape of fine particles of which a particle diameter is in nm size from an atom scale.

Examples of the metal to be used in the metal nanoparticles include a metal such as gold, silver, copper, and platinum, an alloy containing such metals as a main component, or the like. Among them, gold and silver are preferable from the viewpoint of an excellent light reflectance, and of being capable of further improving an efficiency of an organic electronic device to be obtained. Any one type of the metals or the alloys can be independently used, or two or more types thereof can be used by being suitably combined.

It is preferable that the metal ink composition is a metal colloid or a metal nanoparticle dispersion liquid in which front surfaces of the metal nanoparticles are covered with a protective agent, and the metal nanoparticles are stably and independently dispersed in a solvent.

An average particle diameter of less than or equal to 1000 nm from the atom scale can be preferably applied as an average particle diameter of the metal nanoparticles in the metal ink composition. In particular, metal nanoparticles having an average particle diameter in a range of 3 nm to 300 nm are preferably used, and metal nanoparticles having an average particle diameter in a range of 5 nm to 100 nm are more preferably used, as the metal nanoparticles. In particular, silver nanoparticles having an average particle diameter in a range of 3 nm to 100 nm are preferable. In addition, in a metal nanowire, a silver wire having a width of greater than or equal to 1 nm and less than 1000 nm, and preferably having a width of 1 nm to 100 nm, is preferable.

Here, the average particle diameter of the metal nanoparticles and the metal colloid, and the width of the metal nanowire can be obtained by measuring a particle diameter of the metal nanoparticles in the dispersion described above, and the width of the metal nanowire with a transmission electron microscope (TEM). For example, in particles to be observed from a TEM image, particle diameters of 300 independent metal nanoparticles which are not superimposed are measured, and thus, the average particle diameter thereof can be calculated.

In the metal colloid, an organic π joining ligand is preferable as the protective agent covering the front surfaces of the metal nanoparticles. The organic π conjugated ligand is π-joined to the metal nanoparticles, and thus, conductivity is applied to the metal colloid.

One type or two or more types of compounds selected from the group consisting of a phthalocyanine derivative, a naphthalocyanine derivative, and a porphyrin derivative are preferable as the organic π joining ligand.

In addition, in order to improve a coordination with respect to the metal nanoparticles or dispersibility in a dispersion medium, an organic π joining ligand having at least one type of substituent selected from an amino group, an alkyl amino group, a mercapto group, a hydroxyl group, a carboxyl group, a phosphine group, a phosphonic acid group, a sulfonic acid group, a halogen group, a selenole group, a sulfide group, a selenoether group, an amide group, an imide group, a cyano group, a nitro group, and salts thereof as a substituent is preferable as the organic π joining ligand.

In addition, it is possible to use an organic π conjugated ligand described in WO 2011/114713 A as the organic n joining ligand.

One type or two or more types of compounds selected from OTAN, OTAP, and OCAN described below are preferable as a specific compound of the organic π joining ligand.

OTAN: 2,3,11,12,20,21,29,30-octakis[(2-N,N-dimethyl aminoethyl)thio]naphthalocyanine OTAP: 2,3,9,10,16,17,23,24-octakis[(2-N,N-dimethyl aminoethyl)thio]phthalocyanine OCAN: 2,3,11,12,20,21,29,30-naphthalocyanine octacarboxylic acid Examples of a preparation method of the metal nanoparticle dispersion liquid containing the organic π joining ligand include a liquid phase reduction method. In addition, manufacturing of the organic π joining ligand of this embodiment and preparation of the metal nanoparticle dispersion liquid containing the organic π joining ligand can be performed according to a method described in paragraphs [0039] to [0060] of WO 2011/114713 A.

The average particle diameter of the metal colloid is generally in a range of 3 nm to 500 nm, and is preferably in a range of 5 nm to 50 nm. In a case where the average particle diameter of the metal colloid is set to be in the range described above, fusion between the particles easily occurs, and thus, it is possible to improve the conductivity of the thin metal line pattern to be obtained.

In the metal nanoparticle dispersion liquid, it is preferable that a protective agent in which a ligand deviates at a low temperature of lower than or equal to 200° C. is used as the protective agent covering the front surfaces of the metal nanoparticles. Accordingly, the protective agent deviates at a low temperature or low energy, and fusion between the metal nanoparticles occurs, and thus, it is possible to apply the conductivity.

Specifically, a metal nanoparticle dispersion liquid described in JP 2013-142173 A, JP 2012-162767 A, JP 2014-139343 A, JP 5606439 B2, and the like is exemplified.

Examples of the forming material of the metal are capable of including a metal salt, a metal complex, an organic metal compound (a compound having a metal-carbon bond), and the like. The metal salt and the metal complex may be any one of a metal compound having an organic group and a metal compound not having an organic group. BY using the forming material of the metal in the metal ink composition, the metal is generated from the material, and the thin metal line pattern containing the metal is formed.

It is preferable that an organic silver complex compound prepared by a reaction between a silver compound represented by "$Ag_nX$" and an ammonium carbamate-based compound is used as a forming material of metal silver. In "Ag$_n$X", n is an integer of 1 to 4, and X is a substituent selected from the group consisting of oxygen, sulfur, halogen, cyano, cyanate, carbonate, nitrate, nitrite, sulfate, phosphate, thiocyanate, chlorate, perchlorate, tetrafluoroborate, acetyl acetate, and carboxylate.

Examples of the silver compound are capable of including silver oxide, silver thiocyanate, silver cyanide, silver cyanate, silver carbonate, silver nitrate, silver nitrite, silver sulfate, silver phosphate, silver perchlorate, silver tetrafluoroborate, silver acetyl acetate, silver acetate, silver lactate, silver oxalate, and the like. It is preferable to use silver oxide or silver carbonate as the silver compound from the viewpoint of reactivity and the post-treatment.

Examples of the ammonium carbamate-based compound are capable of including ammonium carbamate, ethyl ammonium ethyl carbamate, isopropyl ammonium isopropyl carbamate, n-butyl ammonium n-butyl carbamate, isobutyl ammonium isobutyl carbamate, t-butyl ammonium t-butyl carbamate, 2-ethyl hexyl ammonium 2-ethyl hexyl carbamate, octadecyl ammonium octadecyl carbamate, 2-methoxy ethyl ammonium 2-methoxy ethyl carbamate, 2-cyanoethyl ammonium 2-cyanoethyl carbamate, dibutyl ammonium dibutyl carbamate, dioctadecyl ammonium dioctadecyl carbamate, methyl decyl ammonium methyl decyl carbamate, hexamethylene iminium hexamethylene imine carbamate, morpholium morpholine carbamate, pyridinium ethyl hexyl carbamate, triethylene diaminium isopropyl bicarbamate, benzyl ammonium benzyl carbamate, triethoxy silyl propyl ammonium triethoxy silyl propyl carbamate, and the like. In the ammonium carbamate-based compounds described above, alkyl ammonium alkyl carbamate substituted with primary amine is preferable since primary amine is more excellent than secondary amine or tertiary amine from the viewpoint of reactivity and stability.

The organic silver complex compound can be prepared by a method described in JP 2011-48795 A. For example, it is possible to allow one type of the silver compound to directly react with one type of the ammonium carbamate-based compound in a state of an ordinary pressure or pressurization in a nitrogen atmosphere, without using a solvent. In addition, the reaction can be performed by using a solvent, for example, alcohols such as methanol, ethanol, isopropanol, and butanol, glycols such as ethylene glycol and glycerin, acetates such as ethyl acetate, butyl acetate, and carbitol acetate, ethers such as diethyl ether, tetrahydrofuran, and dioxane, ketones such as methyl ethyl ketone and acetone, a hydrocarbon-based solvent such as hexane and heptane, benzene, an aromatic solvent such as toluene, a solvent substituted with halogen, such as chloroform or methylene chloride, and carbon tetrachloride, and the like.

The structure of the organic silver complex compound can be represented by "Ag[A]$_m$". Furthermore, in "Ag[A]$_m$", A is the ammonium carbamate-based compound, and m is 0.7 to 2.5.

The organic silver complex compound is easily dissolved in various solvents including the solvent manufacturing the organic silver complex compound, for example alcohols such as methanol, esters such as ethyl acetate, ethers such as tetrahydrofuran, and the like. For this reason, the organic silver complex compound can be easily applied to a coating or printing process as the metal ink composition.

In addition, silver carboxylate having a group represented by Formula "—COOAg" can be exemplified as the forming material of metal silver. Silver carboxylate is not particularly limited insofar as having a group represented by Formula "—COOAg". For example, the number of groups represented by Formula "—COOAg" may be only one, or may be greater than or equal to 2. In addition, the position of the group represented by Formula "—COOAg" in the silver carboxylate is not also particularly limited.

One or more types of silver carboxylates selected from the group consisting of β-ketosilver carboxylate and silver carboxylate (4), described in JP 2015-66695 A, are preferable as silver carboxylate. Furthermore, not only β-ketosilver carboxylate and silver carboxylate (4) but also silver carboxylate having a group represented by Formula "—COOAg", including β-ketosilver carboxylate and silver carboxylate (4), can be used as the forming material of metal silver.

In addition, in a case where silver carboxylate described above is contained in the metal ink composition as the forming material of the metal, it is preferable that one or more types of nitrogen-containing compounds selected from the group consisting of an amine compound having carbon atoms of less than or equal to 25, a quaternary ammonium salt, ammonia, an ammonium salt obtained by a reaction between an amine compound or ammonia and an acid are blended along with silver carboxylate.

The amine compound may be any one of primary amine, secondary amine, and tertiary amine, having 1 to 25 carbon atoms. In addition, the quaternary ammonium salt has 4 to 25 carbon atoms. The amine compound and the quaternary ammonium salt may be any one of a chain compound or a cyclic compound. In addition, the number of nitrogen atoms configuring an amine portion or an ammonium salt portion (for example, nitrogen atoms configuring an amino group "—NH$_2$" of primary amine) may be one, or may be greater than or equal to 2.

<Forming Method of Thin Metal Line Pattern>

An example of forming the thin metal line pattern on the resin base material will be described. The thin metal line pattern, for example, is formed by using the metal ink composition. A forming method of the thin metal line pattern is not particularly limited, and a known method of the related art can be used. For example, a method to which a photolithography method, a coating method, and a printing method are applied can be used as the known forming method of the thin metal line pattern of the related art.

The metal ink composition contains the metal nanoparticles, and a solvent, and may contain an additive agent such as a dispersion agent, a viscosity modifier, and a binder. The solvent contained in the metal nanoparticles contain composition is not particularly limited, and a compound having an OH group is preferable, and water, alcohol, and glycol ether are preferable, from the viewpoint of efficiently volatilizing the solvent by middle infrared ray irradiation.

Examples of the solvent used in the metal nanoparticles contain composition include water, methanol, ethanol, propanol, propanol, butanol, pentanol, hexanol, heptanol, octanol, nonanol, decanol, undecanol, dodecanol, tetradecanol, hexadecanol, hexanediol, heptanediol, octanediol, nonanediol, decanediol, farnesol, dedecadienol, linalool, geraniol, nerol, heptadienol, tetradecenol, hexadeceneol, phytol, oleyl alcohol, dedecenol, decenol, undecylenyl alcohol, nonenol, citronerol, octenol, heptenol, methyl cyclohexanol, menthol, dimethyl cyclohexanol, methyl cyclohexenol, terpineol, dihydrocarveol, isopulegol, cresol, trimethyl cyclohexenol, glycerin, ethylene glycol, polyethylene glycol, diethylene glycol, triethylene glycol, tetraethylene glycol, hexylene glycol, propylene glycol, dipropylene glycol, tripropylene glycol, neopentyl glycol, butanediol, pentanediol, heptanediol, propanediol, hexanediol, octanediol, ethylene glycol monoethyl ether, ethylene glycol monobutyl ether, diethylene glycol monomethyl ether, diethylene glycol monoethyl ether, diethylene glycol monobutyl ether, diethylene glycol dimethyl ether, diethylene glycol diethyl ether, triethylene glycol monobutyl ether, dipropylene glycol monomethyl ether, dipropylene glycol monoethyl ether, tripropylene glycol monomethyl ether, and the like.

In a case where the pattern of the metal nanoparticles contain composition is formed by the printing method, in general, a method which is used for forming an electrode pattern can be applied to the printing method. A specific example of a gravure printing method includes methods described in JP 2009-295980 A, JP 2009-259826 A, JP 2009-96189 A, and JP 2009-90662 A, a specific example of a flexo printing method includes methods described in JP 2004-268319 A and JP 2003-168560 A, a specific example of a screen printing method includes methods described in JP 2010-34161 A, JP 2010-10245 A, and JP 2009-302345 A, and a specific example of an ink jet printing method includes methods described in JP 2011-180562 A, JP 2000-127410 A, and JP 8-238774 A.

In a case where the pattern of the metal nanoparticles contain composition is formed by the photolithography method, specifically, the metal ink composition is formed on the entire surface on an underlayer 15 by printing or coating, and is subjected to the drying treatment and the calcining treatment described below, and then, is etched by using a known photolithography method, and thus, is processed to a desired pattern.

Next, the drying treatment of the metal nanoparticles contain composition applied onto the resin base material is performed. The drying treatment can be performed by using a known drying method. For example, air-cooled drying, convection heat transmission drying using hot air or the like, radiation electric heat drying using an infrared ray or the like, conduction heat transmission drying using a hot plate or the like, vacuum drying, internal exothermic drying using a microwave, IPA vapor drying, marangoni drying, rotagoni drying, freezing drying, and the like can be used as the drying method.

It is preferable that heating drying is performed in a temperature range of 50° C. to 200° C. and at a temperature where the resin base material is not deformed. It is preferable that heating is performed in a condition where a surface temperature of the resin base material is 50° C. to 150° C. In a case of using a PET substrate as the substrate, it is particularly preferable that heating is performed in a temperature range of lower than or equal to 100° C. Calcining time depends on a temperature or the size of the metal nanoparticles to be used, but is preferably in a range of 10 seconds to 30 minutes, and is more preferably in a range of 10 seconds to 15 minutes, and is particularly preferably in a range of 10 seconds to 5 minutes, from the viewpoint of productivity.

In the drying treatment, it is preferable that the drying treatment is performed according to infrared ray irradiation. In particular, it is preferable that a specific wavelength region is selectively emitted by a wavelength control infrared ray heater. By selectively using a specific wavelength region, it is possible to selectively irradiate a cut of an absorption region of the resin base material or the solvent of the metal ink composition with an effective specific wavelength. In particular, it is preferable to use an infrared ray heater in which a filament temperature of a light source is in a range of 1600° C. to 3000° C.

Next, the calcining treatment of the dried pattern of the metal ink composition is performed. Furthermore, sufficient conductivity is expressed in the drying treatment according to the type of the metal composition contained in the metal ink composition (for example, the silver colloid or the like having the π joining organic ligand), and thus, a calcining process may not be performed.

The calcining of the pattern of the metal ink composition is performed by light irradiation using a flash lamp (also referred to as flash calcining), and the flash calcining is preferable since the conductivity of the transparent electrode 10 is improved. It is possible to use an electric discharge tube of xenon, helium, neon, argon, and the like as an electric discharge tube of the flash lamp used in the flash calcining, and it is preferable to use a xenon lamp.

It is preferable that a preferred spectrum band of the flash lamp is in a range of 240 nm to 2000 nm. By setting the spectrum band to be in the range described above, a damage on the resin base material due to the flash calcining, such as thermal deformation, decreases.

A light irradiation condition of the flash lamp is arbitrary, but it is preferable that the total light irradiation energy is in a range of 0.1 $J/cm^2$ to 50 $J/cm^2$, and it is more preferable that the total light irradiation energy is in a range of 0.5 $J/cm^2$ to 10 $J/cm^2$. Light irradiation time is preferably in a range of 10 μs to 100 ms, and is more preferably in a range of 100 μs to 10 ms. In addition, the light irradiation may be performed one time or a plurality of times, but it is preferable that the light irradiation is performed in a range of 1 time to 50 times. By performing the flash light irradiation in such preferred condition ranges, it is possible to form the thin metal line pattern without damaging the resin base material.

It is preferable that the flash lamp irradiation with respect to the resin base material resin is performed from the side of the base material on which the pattern of the metal ink composition is formed. In a case where the resin base material is transparent, irradiation may be performed from the resin base material side, or the irradiation may be performed from both sides of the resin base material.

In addition, the surface temperature of the resin base material at the time of flash calcining may be determined in consideration of a heat resistant temperature of the resin base material, a boiling point (a vapor pressure) of the dispersion medium of the solvent contained in the metal ink composition, the type or a pressure of atmosphere gas, and a thermal behavior of the metal ink composition, such as dispersibility or oxidizing properties, and it is preferable that the flash calcining is performed at a temperature of higher than or equal to a room temperature and lower than or equal to 200° C.

A light irradiation device of the flash lamp may satisfy the irradiation energy and the irradiation time described above. In addition, the flash calcining may be performed in the atmosphere, and as necessary, can be performed in an inert gas atmosphere, such as nitrogen, argon, and helium. In particular, it is preferable that the flash calcining is performed in the inert gas atmosphere from the viewpoint of preventing impurities from being generated in the thin metal line.

In addition, it is possible to form a plating layer on the thin metal line pattern. The plating layer can be formed by being coated with a coating liquid of the plating layer according to an intaglio printing method, a stencil printing method, an ink jet method, or the like, and by being subjected to a plating treatment. Example of the plating treatment include an electroplating treatment in which a metal in the coating liquid is precipitated by energization, and thus, a metal film is formed, and an electroless plating treatment in which the metal in the coating liquid can be precipitated by an oxidizing action of a reducing agent but not by energization.

For example, a coating liquid containing a conductive substance, which is a plating nucleus, in the solvent, can be used as the coating liquid of the plating layer. A transition metal or a compound thereof can be used as the conductive substance. Among them, an ionic transition metal such as copper, silver, gold, nickel, palladium, platinum, and cobalt is preferable, and silver, gold, copper, and the like are more preferable from the viewpoint of being capable of forming the plating layer having low resistance and high corrosion resistance.

It is preferable that the conductive substance is in the shape of particles having an average particle diameter of approximately 1 nm to 50 nm. The average particle diameter is an average value at the time of measuring a center particle diameter (D50) by a laser diffraction scattering type particle size distribution measurement device.

It is preferable that the content of the conductive substance in the coating liquid is in a range of 10 mass % to 60 mass %.

In a case of the electroplating treatment, the coating liquid containing the plating nucleus is applied into the shape of the thin metal line pattern, and then, is immersed in an electroplating liquid or is coated with the electroplating liquid, and is subjected to energization, and thus, the metal in the electroplating liquid is precipitated on the thin metal line pattern connected to the negative electrode, and the metal film can be formed. The temperature of the electroplating liquid at the time of coating can be in a range of 20° C. to 98° C.

An electroplating liquid containing a conductive substance such as copper, nickel, chromium, cobalt, and tin, sulfate, an aqueous medium, and the like can be used as the electroplating liquid.

In a case of the electroless plating treatment, the coating liquid containing the plating nucleus is applied into the shape of the thin metal line pattern, and then, an electroless plating liquid containing a reducing agent is further applied, and thus, the metal in the electroless plating liquid is precipitated, and the metal film can be formed. The temperature of the electroless plating liquid at the time of coating can be in a range of approximately 20° C. to 98° C.

For example, an electroless plating liquid containing a conductive substance such as copper, nickel, chromium, cobalt, and tin, a reducing agent, an aqueous medium, a solvent, and the like can be used as the electroless plating liquid. For example, dimethyl aminoborane, a hypophosphorous acid, sodium hypophosphite, dimethyl amine borane, hydrazine, formaldehyde, sodium borohydride, phenols, and the like can be used as the reducing agent.

In addition, the electroless plating liquid is capable of containing a complexing agent, for example, a carboxylic acid such as acetate, a formic acid, a malonic acid, and a succinic acid, a soluble salt thereof, amines such as ethylene diamine, and the like, as necessary.

[1.1.2] Metal Oxide Layer

It is preferable that the metal oxide layer, which can be combined with the thin metal line, can be formed by using a low conductive metal oxide having a volume resistivity of less than $1 \times 10^1$ $\Omega \cdot cm$. The volume resistivity can be obtained by measuring sheet resistance, which is measured on the basis of a resistivity test method according to a four probe method of conductive plastic in MS K 7194-1994, and a film thickness. The film thickness can be measured by using a contact type front surface shape measurement device (for example, DECTAK) or an optical interference surface shape measurement device (for example, WYKO).

The sheet resistance of the metal oxide layer is preferably less than or equal to 10000 $\Omega$/square, and is more preferably less than or equal to 2000 $\Omega$/square.

The thickness of the metal oxide layer can be in a range of 10 nm to 500 nm. It is preferable that the thickness is in a range of 100 nm to 500 nm from the viewpoint of increasing the conductivity. It is preferable that the thickness is greater than or equal to 50 nm from the viewpoint of increasing the smoothness of the front surface.

The metal oxide, which can be used in the metal oxide layer, is not particularly limited insofar as the material has excellent transparency, conductive, and flexibility. Examples of the metal oxide, which can be used in the metal oxide layer, include indium oxide.zinc oxide (IZO), indium oxide doped with gallium (IGO), indium oxide.tin oxide (IWZO), zinc oxide (ZnO), zinc oxide doped with Ga (GZO), indium.gallium.zinc oxide (IGZO), and the like.

In particular, IZO, IGO, and IWZO are preferable as the metal oxide. Among them, it is preferable that IZO has a composition represented by a mass ratio of $In_2O_3:ZnO=80$ to 95:5 to 20. It is preferable that IGO has a composition represented by a mass ratio of $In_2O_3:Ga_2O_3=70$ to 95:5 to 30. It is preferable that IWZO has a composition represented by a mass ratio of $In_2O_3:WO_3:ZnO=95$ to 99.8:0.1 to 2.5:0.1 to 2.5.

In the lead-out electrode portion, it is preferable that the metal oxide layer is a layer not having a crystalline phase (a crystal grain) of the metal oxide, and it is preferable that the metal oxide layer is a layer in which the metal oxide does not have a crystalline phase but has only an amorphous phase.

In the metal oxide layer, a phase state of the metal oxide can be investigated by X-ray diffraction (XRD) measurement. Specifically, a metal oxide layer 14 is subjected to the X-ray diffraction measurement, and the phase state of the metal oxide can be determined according to the presence or absence of a crystalline diffraction peak of the crystalline phase (the crystal grain) in the total X-ray scattering intensity.

In a case where the metal oxide layer is configured only of an amorphous phase, the crystalline diffraction peak does not exist in an X-ray diffraction spectrum. On the other hand, in a case where the metal oxide layer has the crystalline phase (the crystal grain), the crystalline diffraction peak occurs in the X-ray diffraction spectrum.

In the metal oxide layer, the flexibility of the crystalline phase decreases compared to the amorphous phase. It is considered that this is because a crystal grain aggregate or a fracture due to a defect easily occurs in the crystalline phase. For this reason, in a case where the resin base material is used, and the flexibility is required, it is desirable that the crystalline phase does not exist in the metal oxide layer.

Further, in a case where the crystal grain exists in the metal oxide layer, the smoothness of the front surface of the metal oxide layer decreases due to the crystal grain aggregate.

In a case where the smoothness of the front surface of the metal oxide layer decreases, a defect occurs at the time of incorporating the lead-out electrode portion in the organic EL element. For example, a rectification ratio is degraded due to a current leakage, and a current is concentrated on a protrusion portion of the grain aggregate, and thus, in such a portion, short-circuit easily occurs. Therefore, in the metal oxide layer, it is desirable that the crystalline phase of the metal oxide does not exist.

It is preferable that arithmetic average roughness Ra of the metal oxide layer is less than or equal to 5 nm. Further, it is preferable that Ra is less than or equal to 3 nm.

Furthermore, the arithmetic average roughness Ra, for example, is measured by using an atomic force microscope (manufactured by Digital Instruments).

It is preferable that the metal oxide layer is formed of the material by using a sputtering method (for example, including a reactive sputtering method such as magnetron cathode sputtering, planar magnetron sputtering, dipole AC planar magnetron sputtering, dipole AC rotation magnetron sputtering), a vapor deposition method (for example, resistance heating vapor deposition, electron beam vapor deposition, ion beam vapor deposition, plasma support vapor deposition, and the like), a chemical vapor deposition method such as a thermal CVD method, a catalytic chemical vapor growth method (Cat-CVD), a capacitive coupling plasma CVD method (CCP-CVD), an optical CVD method, a plasma CVD method (PE-CVD), an epitaxial growth method, an atomic layer growth method, and the like.

[1.1.3] Metal Thin Film Layer

Examples of the metal used in the metal thin film layer which can be combined with the thin metal line include nickel, cobalt, silver, copper, gold, palladium, and the like. One type of the metal may be independently used, or two or more types thereof may be used together. Among them, nickel, silver, and copper are preferable. In order to prevent the front surface of the metal from being oxidized, particles may be used in which the front surface is subjected to gold and palladium. Further, an insulating film may be formed on the front surface with a metal protrusion or an organic substance.

Examples of resin particles covered with a metal include particles in which a front surface of a resin core is covered with any one metal of nickel, copper, gold, and palladium. Similarly, particles may be used in which the outermost surface of the resin core is subjected to gold and palladium. Further, an insulating film may be formed on the front surface of the resin core with a metal protrusion or an organic substance.

Among them, silver or an alloy containing silver as a main component is preferable, and in a case where a layer is configured by containing silver as a main component, it is preferable that purity of silver is greater than or equal to 99%. In addition, in order to ensure stability of silver, palladium (Pd), copper (Cu), gold (Au), and the like may be added.

In a case where a layer is configured by containing silver as a main component, specifically, the layer may be formed only of silver, or may be configured of an alloy containing silver (Ag). Examples of such an alloy include silver.magnesium (Ag.Mg), silver.copper (Ag.Cu), silver.palladium (Ag.Pd), silver.palladium.copper (Ag.Pd.Cu), silver.indium (Ag.In), and the like.

In a case where a layer is configured by containing silver as a main component, a thickness is preferably in a range of 2 nm to 20 nm, and is more preferably in a range of 4 nm to 12 nm, from the viewpoint of the transparency. It is preferable that the thickness is less than or equal to 20 nm, since an absorption component and a reflection component of the lead-out electrode portion are suppressed to be low, and a high light transmittance is maintained.

The layer configured by containing silver as a main component indicates that the content of silver in the transparent positive electrode is greater than or equal to 60 mass %, is preferably greater than or equal to 80 mass %, is more preferably greater than or equal to 90 mass %, and is particularly preferably greater than or equal to 98 mass %.

In addition, the layer configured by containing silver as a main component, as necessary, may be configured by being laminated in a plurality of layers.

In addition, in the present invention, in a case where a layer is configured by containing silver as a main component, it is preferable that an underlayer is disposed under the layer from the viewpoint of increasing homogeneity of the silver film of the lead-out electrode portion to be formed. The underlayer is not particularly limited, and a layer containing an organic compound having a nitrogen atom or a sulfur atom is preferable, and a method of forming the lead-out electrode portion on the underlayer is a preferred aspect.

It is preferable that the underlayer is a layer containing a nitrogen-containing organic compound, and in a case where the underlayer is formed on a substrate, and examples of a film formation method include a method using a wet process, such as a coating method, an ink jet method, a coating method, and a dip method, a method using a dry process, such as a vapor deposition method (resistance heating, an EB method, and the like), a sputtering method, and a CVD method, and the like. Among them, the vapor deposition method is preferably applied.

The nitrogen-containing organic compound configuring the underlayer is not particularly limited, insofar as the nitrogen-containing organic compound is a compound having a nitrogen atom in molecules, and a compound having a nitrogen-containing heterocyclic ring is preferable. Examples of the nitrogen-containing heterocyclic ring include aziridine, azirine, azetidine, azeto, azolidine, azole, azinane, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-C-cinnoline, porphyrin, chlorin, choline, and the like.

Further, it is possible to refer to a compound described in paragraphs [0097] to [0221] of JP 2015-046364 A as a specific compound.

[1.1.4] Conductive Polymer Layer

It is preferable that a π conjugated conductive polymer containing a polyanion is used a conductive polymer which can be combined with the thin metal line.

Examples of the π conjugated conductive polymer, which can be used, include polythiophenes, polypyrroles, polyindoles, polycarbazoles, polyanilines, polyacetylenes, polyfurans, polyparaphenylene vinylenes, polyazulenes, polyparaphenylenes, polyparaphenylene sulfides, polyisothianaphthenes, polythiazyls, and the like. Among them, polythiophenes or polyanilines is preferable, and polyethylene dioxythiophene is more preferable, from the viewpoint of increasing the conductivity, the transparency, the stability, and the like.

The π conjugated conductive polymer can be easily manufactured by performing chemical oxidative polymerization with respect to a precursor monomer forming the π conjugated conductive polymer in the presence of an oxidant, an oxidative catalyst, and a polyanion. The precursor monomer to be used for forming the π conjugated conductive polymer has π conjugation in molecules, and has the π conjugation in a main chain even at the time of being polymerized according to the action of the oxidant. Examples of such a precursor monomer include pyrroles, thiophenes, anilines, a derivative thereof, and the like.

A specific example of the precursor monomer includes pyrrole, 3-methyl pyrrole, 3-ethyl pyrrole, 3-n-propyl pyrrole, 3-butyl pyrrole, 3-octyl pyrrole, 3-decyl pyrrole, 3-dodecyl pyrrole, 3,4-dimethyl pyrrole, 3,4-dibutyl pyrrole, 3-carboxyl pyrrole, 3-methyl-4-carboxyl pyrrole, 3-methyl-4-carboxy ethyl pyrrole, 3-methyl-4-carboxy butyl pyrrole, 3-hydroxy pyrrole, 3-methoxy pyrrole, 3-ethoxy pyrrole, 3-butoxy pyrrole, 3-hexyl oxypyrrole, 3-methyl-4-hexyl oxypyrrole, thiophene, 3-methyl thiophene, 3-ethyl thiophene, 3-propyl thiophene, 3-butyl thiophene, 3-hexyl thiophene, 3-heptyl thiophene, 3-octyl thiophene, 3-decyl thiophene, 3-dodecyl thiophene, 3-octadecyl thiophene, 3-bromothiophene, 3-chlorothiophene, 3-iodothiophene, 3-cyanothiophene, 3-phenyl thiophene, 3,4-dimethyl thiophene, 3,4-dibutyl thiophene, 3-hydroxy thiophene, 3-methoxy thiophene, 3-ethoxy thiophene, 3-butoxy thiophene, 3-hexyl oxythiophene, 3-heptyl oxythiophene, 3-octyl oxythiophene, 3-decyl oxythiophene, 3-dodecyl oxythiophene, 3-octadecyl oxythiophene, 3,4-dihydroxy thiophene, 3,4-dimethoxy thiophene, 3,4-diethoxy thiophene, 3,4-dipropoxy thiophene, 3,4-dibutoxy thiophene, 3,4-dihexyl oxythiophene, 3,4-diheptyl oxythiophene, 3,4-dioctyl oxythiophene, 3,4-didecyl oxythiophene, 3,4-didodecyl oxythiophene, 3,4-ethylene dioxythiophene, 3,4-propylene dioxythiophene, 3,4-butene dioxythiophene, 3-methyl-4-methoxy thiophene, 3-methyl-4-ethoxy thiophene, 3-carboxy thiophene, 3-methyl-4-carboxy thiophene, 3-methyl-4-carboxy ethyl thiophene, 3-methyl-4-carboxy butyl thiophene, aniline, 2-methyl aniline, 3-isobutyl aniline, a 2-aniline sulfonic acid, a 3-aniline sulfonic acid, and the like.

The polyanion is substituted or unsubstituted polyalkylene, substituted or unsubstituted polyalkenylene, substituted or unsubstituted polyimide, substituted or unsubstituted polyamide, substituted or unsubstituted polyester, or a copolymer thereof, and is a compound formed of a configuration unit having an anion group and a configuration unit not having an anion group. The polyanion solubilizes or disperses the π conjugated conductive polymer in a solvent, and the anion group of the polyanion functions as a dopant with respect to the π conjugated conductive polymer, and thus, conductivity and heat resistance of the π conjugated conductive polymer are improved.

The anion group of the polyanion may be a functional group which may cause chemical oxidation doping with respect to the π conjugated conductive polymer, and a monosubstituted sulfate ester group, a monosubstituted phosphate ester group, a phosphate group, a carboxy group, a sulfo group, and the like are preferable from the viewpoint of easy manufacturing and high stability. Among them, the sulfo group, the monosubstituted sulfate ester group, or the carboxy group is more preferable from the viewpoint of a doping effect of the functional group with respect to the π conjugated conductive polymer.

A specific example of the polyanion includes a polyvinyl sulfonic acid, a polystyrene sulfonic acid, a polyallyl sulfonic acid, a polyacrylate ethyl sulfonic acid, a polyacrylate butyl sulfonic acid, a poly-2-acrylamide-2-methyl propane sulfonic acid, a polyisoprene sulfonic acid, a polyvinyl carboxylic acid, a polystyrene carboxylic acid, a polyallyl carboxylic acid, a polyacrylcarboxylic acid, a polymethacrylcarboxylic acid, a poly-2-acrylamide-2-methyl propane carboxylic acid, a polyisoprene carboxylic acid, polyacrylate, and the like. Further, the polyanion may be a homopolymer of the specific example, or may be a copolymer of two or more types thereof.

In addition, a fluorinated polyanion having a fluorine atom in molecules can also be used. Specifically, Nafion (manufactured by E. I. du Pont de Nemours and Company) containing a perfluorosulfonic acid group, Flemion (manufactured by Asahi Glass Co., Ltd) formed of perfluoro-type vinyl ether containing carboxylic acid group, and the like are included.

In a polymerization degree of the polyanion, it is preferable that the number of monomer units is in a range of 10 to 100000, and it is more preferable that the number of monomer units is in a range of 50 to 10000, from the viewpoint of increasing solubility and conductivity with respect to the solvent.

A ratio of the π conjugated conductive polymer to the polyanion in the conductive polymer, that is, a mass ratio of π Conjugated Conductive Polymer:Polyanion can be 1:1 to 20, and is preferably 1:2 to 10 from the viewpoint of increasing the conductivity and the dispersibility.

A commercially available product may be used as the conductive polymer, and examples of a commercially available product of a conductive polymer formed of poly(3,4-ethylene dioxythiophene) and a polystyrene sulfonic acid (hereinafter, simply referred to as PEDOT/PSS), include Clevios series manufactured by Heraeus Holding GmbH, PEDOT-PSS 483095 and 560596 manufactured by Sigma-Aldrich Japan, Denatron series manufactured by Nagase ChemteX Corporation, and the like. In addition, ORMECON series manufactured by Nissan Chemical Industries, Ltd. and the like can be used as a commercially available product of the polyaniline.

A coated film is formed by applying the coating liquid containing the conductive polymer onto the thin metal line with, and the coated film is irradiated with an infrared ray and is dried, and thus, the transparent electrode can be formed.

A coating method such as a gravure printing method, a flexo printing method, a screen printing method, a roll coat method, a bar coat method, a dip coating method, a spin coating method, a casting method, a die coat method, a blade coat method, a bar coat method, a gravure coat method, a curtain coat method, a spray coat method, a doctor coat method, and an ink jet method can be used as a forming method of the coated film.

It is preferable that the irradiation with the infrared ray is performed in a drying treatment tank where a moisture concentration is less than or equal to 100 ppm. The moisture concentration of the drying treatment tank indicates a moisture concentration at a drying end point in a tank where the drying treatment is performed. In the infrared ray, it is preferable to emit an infrared ray in which a ratio of a light radiance at a wavelength 5.8 μm to a light radiance at a wavelength 3.0 μm is less than or equal to 5%.

Further, it is preferable that the lead-out electrode contains a non-conductive polymer along with the conductive polymer, and it is more preferable that the non-conductive polymer contains at least one of a self-dispersion type polymer and a hydroxy group-containing polymer, from the viewpoint of increasing the transparency. By using the non-conductive polymer, it is possible to reduce the content of the conductive polymer without impairing the conductivity of the lead-out electrode.

The self-dispersion type polymer, which can be used together with the conductive polymer, is a non-conductive polymer which has a dissociable group, and is capable of being dispersed in an aqueous medium as a self-dispersion type polymer unit without causing colloid particles formed of the self-dispersion type polymer to be aggregated even in a case of not using a surfactant, an emulsifier, or the like for assisting micelle formation. It is preferable that the self-dispersion type polymer has high transparency, since it is possible to increase transparency of a conductive polymer layer.

A used amount of the self-dispersion type polymer can be in a range of 50 mass % to 1000 mass % with respect to the conductive polymer.

Examples of a main skeleton of the self-dispersion type polymer includes polyethylene, polyethylene-polyvinyl alcohol (PVA), polyethylene-polyacetate vinyl, polyethylene-polyurethane, polybutadiene, polybutadiene-polystyrene, polyamide (nylon), polyvinylidene chloride, polyester, polyacrylate, polyacrylate-polyester, polyacrylate-polystyrene, polyacetate vinyl, polyurethane-polycarbonate, polyurethane-polyether, polyurethane-polyester, polyurethane-polyacrylate, silicone, silicone-polyurethane, silicone-polyacrylate, polyvinylidene fluoride-polyacrylate, polyfluoroolefin-polyvinyl ether, and the like. In addition, a copolymer may be used in which such a skeleton is used in the base, and other monomers are used. Among them, polyester resin emulsion and polyester-acrylic resin emulsion having an ester skeleton, acrylic resin emulsion having an acryl skeleton, or polyethylene resin emulsion having an ethylene skeleton is preferable.

Yodosol AD-176 and AD-137 (Acrylic Resin: manufactured by Henkel Japan Ltd.), Vilonal MD-1200, MD-1245, and MD-1500 (Polyester Resin: manufactured by TOYOBO CO., LTD.), Plascoat RZ570, Plascoat Z561, Plascoat Z565, Plascoat Z687, and Plascoat Z690 (Polyester Resin: manufactured by GOO Chemical Co., Ltd.), and the like can be used as a commercially available product of the self-dispersion type polymer. One type or a plurality of types of self-dispersion type polymer dispersion liquids having a dissociable group, which can be dispersed in the aqueous medium described above, can be used.

The hydroxy group-containing polymer is a non-conductive polymer having a hydroxy group.

A ratio of the conductive polymer to the hydroxy group-containing polymer, that is, a mass ratio of Conductive Polymer:Hydroxy Group-Containing Polymer is preferably 100:30 to 900, and is more preferably 100:100 to 900 from the viewpoint of preventing a current leakage and of increasing the transparency.

Examples of the hydroxy group-containing polymer include a polymer having a structural unit represented by General Formula (1) described below.

[Chemical Formula 1]

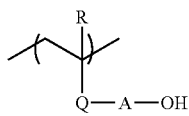

[In General Formula (1) described above, R represents a hydrogen atom or a methyl group. Q represents —C(=O)O— or —C(=O)NRa—. Ra represents a hydrogen atom or an alkyl group. A represents a substituted or unsubstituted alkylene group, or —(CH$_2$CHRbO)$_x$CH$_2$CHRb—. Rb represents a hydrogen atom or an alkyl group. x represents the number of average repeating units.]

Such a resin can be easily mixed with the conductive polymer, and also has the effect of the second dopant described above, and thus, it is possible to increase a film thickness of a conductive polymer-containing layer by using a water-soluble binder resin together, without decreasing the conductivity and the transparency.

The water-soluble binder resin is a binder resin which is soluble in water, and the water-soluble binder resin indicates a binder resin which is dissolved in 100 g of water at 25° C. by greater than or equal to 0.001 g. The dissolution can be measured by a hazemeter and a turbidimeter.

It is preferable that the water-soluble binder resin is transparent.

It is preferable that the water-soluble binder resin has the structural unit represented by General Formula (1) described above. The water-soluble binder resin may be a homopolymer represented by General Formula (1) described above, or other components may be copolymerized. In a case where other components are copolymerized, the content of the structural unit represented by General Formula (1) described above is preferably greater than or equal to 10 mol %, is more preferably greater than or equal to 30 mol %, and is even more preferably greater than or equal to 50 mol %.

In addition, the content of the water-soluble binder resin in the conductive polymer-containing layer is preferably greater than or equal to 40 mass % and less than or equal to 95 mass %, and is more preferably greater than or equal to 50 mass % and less than or equal to 90 mass %.

In the structural unit having a hydroxy group, represented by General Formula (1), R represents a hydrogen atom or a methyl group. Q represents —C(=O)O— or —C(=O)NRa—, and Ra represents a hydrogen atom or an alkyl group. The alkyl group, for example, is preferably linear or branched alkyl group having 1 to 5 carbon atoms, and is more preferably a methyl group. In addition, the alkyl group may be substituted with a substituent. For example, the alkyl group may be substituted with a substituent such as an alkyl group, a cycloalkyl group, an aryl group, a hetrocycloalkyl group, a hetroaryl group, a hydroxy group, a halogen atom, an alkoxy group, an alkyl thio group, an aryl thio group, a cycloalkoxy group, an aryl oxy group, an acyl group, an alkyl carbon amide group, an aryl carbon amide group, an alkyl sulfone amide group, an aryl sulfone amide group, an ureido group, an aralkyl group, a nitro group, an alkoxy carbonyl group, an aryl oxycarbonyl group, an aralkyl oxycarbonyl group, an alkyl carbamoyl group, an aryl carbamoyl group, an alkyl sulfamoyl group, an aryl sulfamoyl group, an acyl oxy group, an alkenyl group, an alkynyl group, an alkyl sulfonyl group, an aryl sulfonyl group, an alkyl oxysulfonyl group, an aryl oxysulfonyl group, an alkyl sulfonyl oxy group, and an aryl sulfonyl oxy group. Among them, the hydroxy group and the alkyl oxy group are preferable.

The halogen atom described above includes a fluorine atom, a chlorine atom, a bromine atom, and an iodine atom.

The alkyl group described above may be a branched alkyl group, and in the alkyl group, the number of carbon atoms is preferably 1 to 20, is more preferably 1 to 12, and is even more preferably 1 to 8. Examples of the alkyl group include a methyl group, an ethyl group, a propyl group, an isopropyl group, a butyl group, a t-butyl group, a hexyl group, an octyl group, and the like.

In the cycloalkyl group described above, the number of carbon atoms is preferably 3 to 20, is more preferably 3 to 12, and is even more preferably 3 to 8. Examples of the cycloalkyl group include a cyclopropyl group, a cyclobutyl group, a cyclopentyl group, and a cyclohexyl group.

The alkoxy group described above may be a branched alkoxy group, and in the alkoxy group, the number of carbon atoms is preferably 1 to 20, is more preferably 1 to 12, is even more preferably 1 to 6, and is most preferably 1 to 4. Examples of the alkoxy group include a methoxy group, an ethoxy group, a 2-methoxy ethoxy group, a 2-methoxy-2- ethoxy ethoxy group, a butyl oxy group, a hexyl oxy group, and an octyl oxy group, and the ethoxy group is preferable.

The alkyl thio group described above may be a branched alkyl thio group, and in the alkyl thio group, the number of carbon atoms is preferably 1 to 20, is more preferably 1 to 12, is even more preferably 1 to 6, and is most preferably 1 to 4. Examples of the alkyl thio group include a methyl thio group, an ethyl thio group, and the like.

In the aryl thio group described above, the number of carbon atoms is preferably 6 to 20, and is more preferably 6 to 12. Examples of the aryl thio group include a phenyl thio group, a naphthyl thio group, and the like.

In the cycloalkoxy group described above, the number of carbon atoms is preferably 3 to 12, and is more preferably 3 to 8. Examples of the cycloalkoxy group include a cyclopropoxy group, a cyclobutyroxy group, a cyclopentyroxy group, and a cyclohexyroxy group.

In the aryl group described above, the number of carbon atoms is preferably 6 to 20, and is more preferably 6 to 12. Examples of the aryl group include a phenyl group and a naphthyl group.

In the aryl oxy group described above, the number of carbon atoms is preferably 6 to 20, and is more preferably 6 to 12. Examples of the aryl oxy group include a phenoxy group and a naphthoxy group.

In the hetrocycloalkyl group described above, the number of carbon atoms is preferably 2 to 10, and is more preferably 3 to 5. Examples of the hetrocycloalkyl group include a piperidino group, a dioxanyl group, and a 2-morpholinyl group.

In the hetroaryl group described above, the number of carbon atoms is preferably 3 to 20, and is more preferably 3 to 10. Examples of the hetroaryl group include a thienyl group and a pyridinyl group.

In the acyl group described above, the number of carbon atoms is preferably 1 to 20, and is more preferably 1 to 12. Examples of the acyl group include a formyl group, an acetyl group, and a benzoyl group.

In the alkyl carbon amide group described above, the number of carbon atoms is preferably 1 to 20, and is more preferably 1 to 12. Examples of the alkyl carbon amide group include an acetoamide group and the like.

In the aryl carbon amide group described above, the number of carbon atoms is preferably 1 to 20, and is more preferably 1 to 12. Examples of the aryl carbon amide group include a benzamide group and the like.

In the alkyl sulfone amide group described above, the number of carbon atoms is preferably 1 to 20, and is more preferably 1 to 12. Examples of the sulfone amide group include a methane sulfone amide group and the like.

In the aryl sulfone amide group described above, the number of carbon atoms is preferably 1 to 20, and is more preferably 1 to 12. Examples of the aryl sulfone amide group include a benzene sulfone amide group and a p-toluene sulfone amide group.

In the aralkyl group described above, the number of carbon atoms is preferably 7 to 20, and is more preferably 7 to 12. Examples of the aralkyl group include a benzyl group, a phenethyl group, and a naphthyl methyl group.

In the alkoxy carbonyl group described above, the number of carbon atoms is preferably 1 to 20, and is more preferably 2 to 12. Examples of the alkoxy carbonyl group include a methoxy carbonyl group.

In the aryl oxycarbonyl group described above, the number of carbon atoms is preferably 7 to 20, and is more preferably 7 to 12. Examples of the aryl oxycarbonyl group include a phenoxy carbonyl group.

In the aralkyl oxycarbonyl group described above, the number of carbon atoms is preferably 8 to 20, and is more preferably 8 to 12. Examples of the aralkyl oxycarbonyl group include a benzyl oxycarbonyl group.

In the acyl oxy group described above, the number of carbon atoms is preferably 1 to 20, and is more preferably 2 to 12. Examples of the acyl oxy group include an acetoxy group and a benzoyl oxy group.

In the alkenyl group described above, the number of carbon atoms is preferably 2 to 20, and is more preferably 2 to 12. Examples of the alkenyl group include a vinyl group, an allyl group, and an isopropenyl group.

In the alkynyl group described above, the number of carbon atoms is preferably 2 to 20, and is more preferably 2 to 12. Examples of the alkynyl group include an ethynyl group.

In the alkyl sulfonyl group described above, the number of carbon atoms is preferably 1 to 20, and is more preferably 1 to 12. Examples of the alkyl sulfonyl group include a methyl sulfonyl group and an ethyl sulfonyl group.

In the aryl sulfonyl group described above, the number of carbon atoms is preferably 6 to 20, and is more preferably 6 to 12. Examples of the aryl sulfonyl group include a phenyl sulfonyl group and a naphthyl sulfonyl group.

In the alkyl oxysulfonyl group described above, the number of carbon atoms is preferably 1 to 20, and is more preferably 1 to 12. Examples of the alkyl oxysulfonyl group include a methoxy sulfonyl group and an ethoxy sulfonyl group.

In the aryl oxysulfonyl group described above, the number of carbon atoms is preferably 6 to 20, and is more preferably 6 to 12. Examples of the aryl oxysulfonyl group include a phenoxy sulfonyl group and a naphthoxy sulfonyl group.

In the alkyl sulfonyl oxy group described above, the number of carbon atoms is preferably 1 to 20, and is more preferably 1 to 12. Examples of the alkyl sulfonyl oxy group include a methyl sulfonyl oxy group and an ethyl sulfonyl oxy group.

In the aryl sulfonyl oxy group described above, the number of carbon atoms is preferably 6 to 20, and is more preferably 6 to 12. Examples of the aryl sulfonyl oxy group include a phenyl sulfonyl oxy group and a naphthyl sulfonyl oxy group. The substituents may be identical to each other or different from each other, and the substituents may be further substituted.

In the structural unit having a hydroxy group, represented by General Formula (1) described above, A represents a substituted or unsubstituted alkylene group, or $-(CH_2CHRbO)_xCH_2CHRb-$. The alkylene group, for example, is preferably an alkylene group having 1 to 5 carbon atoms, and is more preferably an ethylene group and a propylene group. The alkylene group may be substituted with the substituents described above. In addition, Rb represents a hydrogen atom and an alkyl group. The alkyl group, for example, is preferably a linear or branched alkyl group having 1 to 5 carbon atoms, and is more preferably a methyl group. In addition, the alkyl group may be substituted with the substituents described above. Further, x represents the number of average repeating units, is preferably 0 to 100, and is more preferably 0 to 10. The number of repeating units has distribution, is represented by an average value, and may be represented by one digit after the decimal point.

Hereinafter, a representative specific example of the structural unit represented by General Formula (1) will be described, but the present invention is not limited thereto.

[Chemical Formula 2]
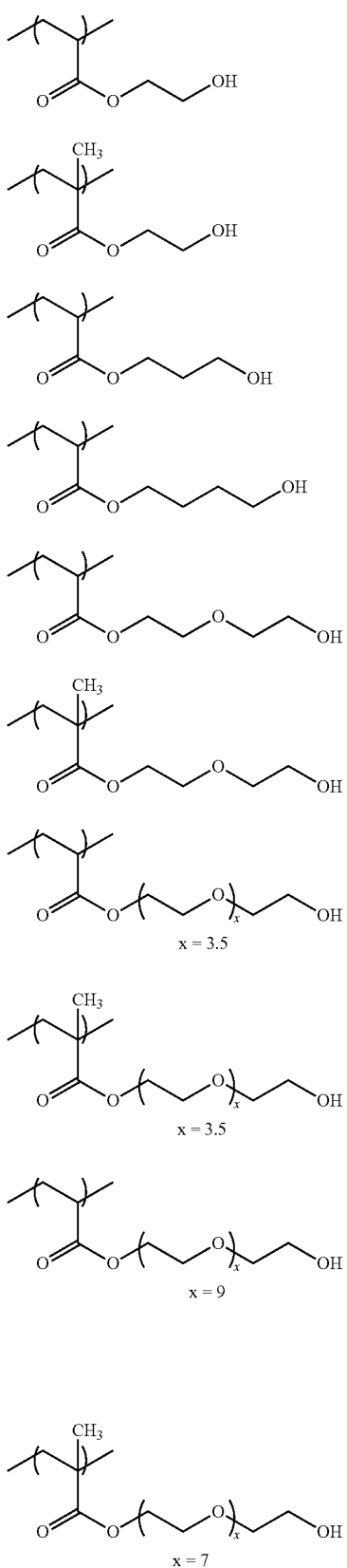
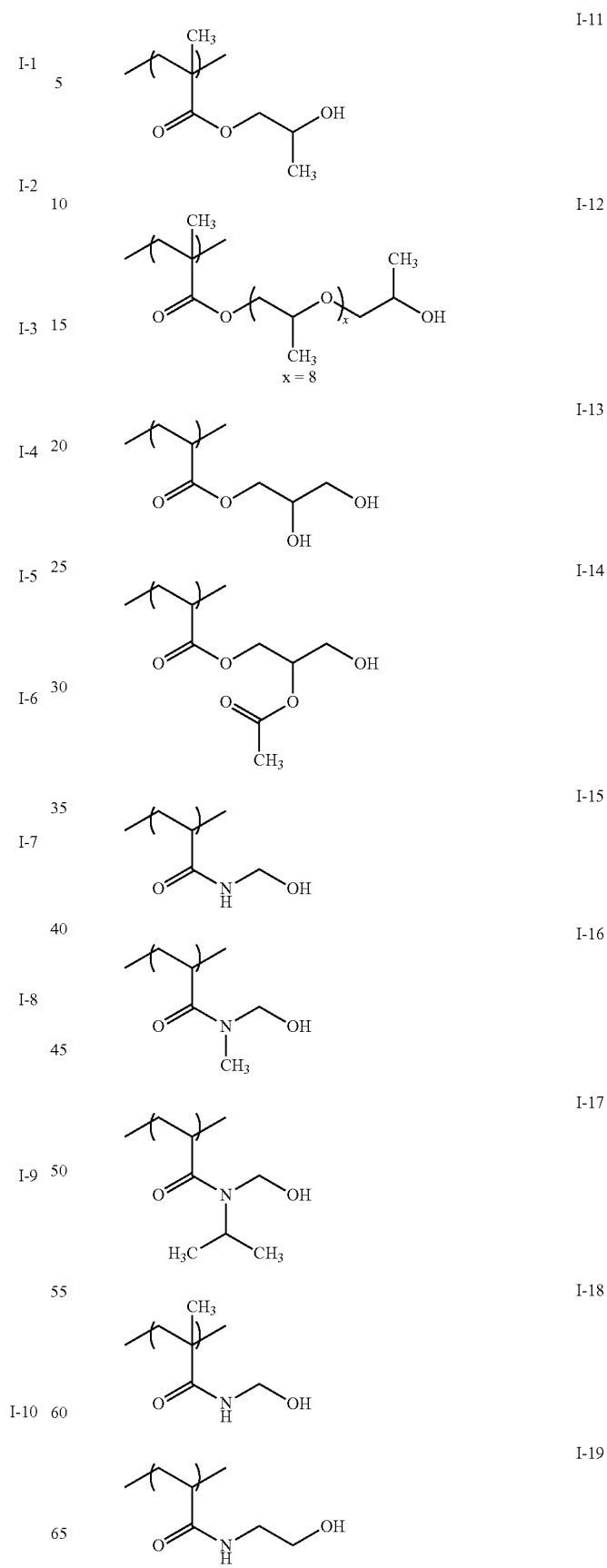

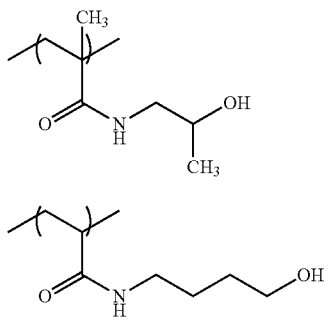

I-20

I-21

The water-soluble binder resin, which is used in the present invention, can be obtained by radical polymerization using a general-purpose polymerization catalyst. Examples of a polymerization method include aggregation polymerization, solution polymerization, suspension polymerization, emulsification polymerization, and the like, and the solution polymerization is preferable. A polymerization temperature is difference according to an initiator to be used, but in general, is in a range of −10° C. to 250° C., is preferably in a range of 0° C. to 200° C., and is more preferably in a range of 10° C. to 100° C.

The number average molecular weight (Mn) of the water-soluble binder resin, which is used in the present invention, is preferably in a range of 3000 to 2000000, is more preferably in a range of 4000 to 500000, and is even more preferably in a range of 5000 to 100000.

The measurement of the number average molecular weight (Mn) and the molecular weight distribution (Weight Average Molecular Weight/Number Average Molecular Weight=Mw/Mn) of the water-soluble binder resin, which is used in the present invention, can be performed by a gel permeation chromatography (GPC), which is generally known. The solvent to be used is not particularly limited insofar as dissolving the binder resin, and tetrahydrofuran (THF), dimethyl formamide (DMF), and $CH_2Cl_2$ are preferable, THF and DMF are more preferable, and DMF is even more preferable, as the solvent. In addition, a measurement temperature is not also particularly limited, but 40° C. is preferable as the measurement temperature.

Figure 5:
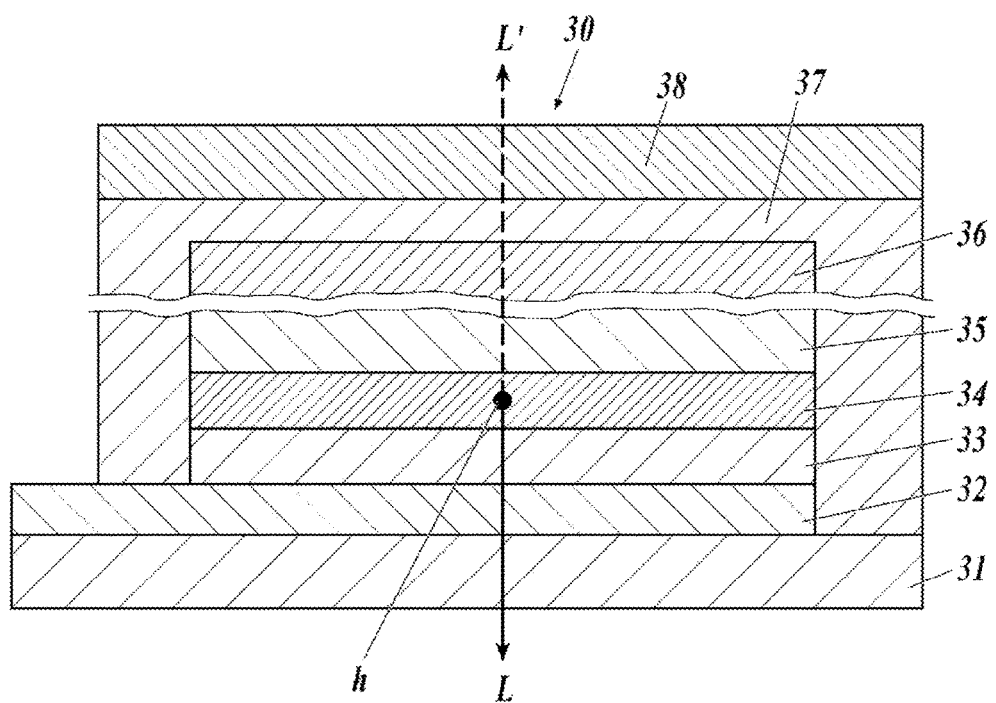
FIG. 5 is a schematic sectional view illustrating a layer configuration of the transparent organic EL element of the present invention.

[2] Configuration and Manufacturing Method of Organic Electroluminescence Element FIG. 5 is a schematic sectional view illustrating a layer configuration of the transparent organic EL element of the present invention.

In a transparent organic EL element 30 of the present invention, a positive electrode 32, a first carrier functional layer group 33, a light emitting layer 34, a second carrier functional layer group 35, and a negative electrode 36 are laminated on a transparent base material 31, and thus, the organic EL element portion according to the present invention is configured. The first carrier functional layer group, for example, is configured of a hole injecting layer, a hole transporting layer, an electron inhibiting layer, and the like, and the second carrier functional layer group, for example, is configured of a hole inhibiting layer, an electron transporting layer, an electron injecting layer, and the like. Each of the first carrier functional layer group and the second carrier functional layer group may be configured of only one layer, or each of the first carrier functional layer group and the second carrier functional layer group may not be provided.

In addition, the organic EL element is sealed with a sealing material 38 through an adhesive agent 37 to cover the positive electrode 32 to the negative electrode 36.

By energizing the positive electrode and the negative electrode, light L and L' emitted from a light emission center h of the light emitting layer is led out from both surfaces of the transparent organic EL element 30.

Hereinafter, a representative example of the configuration of the organic EL element portion according to the present invention will be described.

(i) Positive Electrode/Hole Injecting and Transporting Layer/Light Emitting Layer/Electron Injecting and Transporting Layer/Negative Electrode (ii) Positive Electrode/Hole Injecting and Transporting Layer/Light Emitting Layer/Hole Inhibiting Layer/Electron Injecting and Transporting Layer/Negative Electrode (iii) Positive Electrode/Hole Injecting and Transporting Layer/Electron Inhibiting Layer/Light Emitting Layer/Hole Inhibiting Layer/Electron Injecting and Transporting Layer/Negative Electrode (iv) Positive Electrode/Hole Injecting Layer/Hole Transporting Layer/Light Emitting Layer/Electron Transporting Layer/Electron Injecting Layer/Negative Electrode (v) Positive Electrode/Hole Injecting Layer/Hole Transporting Layer/Light Emitting Layer/Hole Inhibiting Layer/Electron Transporting Layer/Electron Injecting Layer/Negative Electrode (vi) Positive Electrode/Hole Injecting Layer/Hole Transporting Layer/Electron Inhibiting Layer/Light Emitting Layer/Hole Inhibiting Layer/Electron Transporting Layer/Electron Injecting Layer/Negative Electrode Further, the organic EL element 1 may include an interlayer having non-light emission properties. The interlayer may be a charge generating layer, or may have a multiphoton unit configuration.

The outline of the organic EL element, which can be applied to the present invention, for example, includes configurations described in JP 2013-157634 A, JP 2013-168552 A, JP 2013-177361 A, JP 2013-187211 A, JP 2013-191644 A, JP 2013-191804 A, JP 2013-225678 A, JP 2013-235994 A, JP 2013-243234 A, JP 2013-243236 A, JP 2013-242366 A, JP 2013-243371 A, JP 2013-245179 A, JP 2014-003249 A, JP 2014-003299 A, JP 2014-013910 A, JP 2014-017493 A, and JP 2014-017494 A.

Further, each layer configuring the organic EL element other than the electrode will be described.

[2.1] Transparent Base Material

Examples of the transparent base material, which can be applied to the organic EL element of the present invention, are capable of including a transparent material such as glass and plastic. Examples of the transparent base material, which is preferably used, are capable of including glass, quartz, a resin film, and the like, and it is particularly preferable that the transparent base material is a resin base material using a resin film from the viewpoint of providing a flexible organic EL element.

Examples of the glass material include silica glass, soda lime silica glass, lead glass, borosilicate glass, alkali-free glass, and the like. A physical treatment such as grinding, a film formed of an inorganic substance or an organic substance, a hybrid film combined with the film can be formed on a front surface of the glass material, from the viewpoint of adhesiveness with respect to the adjacent layer, the durability, and the smoothness, as necessary.

Examples of a material configuring the resin base material are capable of including polyester such as polyethylene terephthalate (PET) and polyethylene naphthalate (PEN), cellulose esters and derivatives thereof such as polyethylene, polypropylene, cellophane, cellulose diacetate, cellulose triacetate (TAC), cellulose acetate butyrate, cellulose acetate propionate (CAP), cellulose acetate phthalate, and cellulose nitrate, a cycloolefin-based resin such as polyvinylidene chloride, polyvinyl alcohol, polyethylene vinyl alcohol, syndiotactic polystyrene, polycarbonate, a norbornene resin, polymethyl pentene, polyether ketone, polyimide, polyether sulfone (PES), polyphenylene sulfide, polysulfones, polyether imide, polyether ketone imide, polyamide, fluorine resin, nylon, polymethyl methacrylate, acryl and polyarylates, Arton (Product Name, manufactured by JSR Corporation), and Apel (Product Name, manufactured by Mitsui Chemicals, Inc.), and the like.

In the organic EL element, a gas barrier layer may be disposed on the transparent base material described above, as necessary.

The organic light emitting layer is extremely sensitive to oxygen, moisture, and the like, and thus, various oxygen/moisture blocking performances of glass are required. In a case where the base material is not glass (in a case of the resin film or the like), it is necessary to dispose a protective layer having oxygen and moisture barrier properties on the outermost layer of a layer which is contact with the outside without having the base material itself.

A film formed of an inorganic substance or an organic substance, or a hybrid film combined with the film may be formed a front surface of the resin film. It is preferable that the film and the hybrid film is a barrier film (also referred to as a gas barrier film) having a moisture vapor permeability (25±0.5° C., relative humidity 90±2% RH) of less than or equal to 0.01 g/(m$^2$·24 hours), measured by a method based on JIS-K-7129-1992. Further, it is preferable that the film and the hybrid film is a film having higher barrier properties in which an oxygen permeability measured by a method based on JIS-K-7126-1987 is less than or equal to $10^{-3}$/(m$^2$·24 hours·atm), and a moisture vapor permeability is less than or equal to $10^{-5}$ g/(m$^2$·24 hours).

A material forming the gas barrier film as described above may be a material having a function of suppressing the penetration of moisture, oxygen, or the like, which degrades the element, and for example, silicon oxide, silicon dioxide, silicon nitride, and the like can be used as the material. Further, it is more preferable to have a lamination structure of the layer formed of the inorganic layer and the organic material (an organic layer), in order to improve brittleness of the gas barrier film. A lamination sequence of the inorganic layer and the organic layer is not particularly limited, and it is preferable that the inorganic layer and the organic layer are laminated on each other a plurality of times.

A forming method of the gas barrier film is not particularly limited, and for example, a vacuum vapor deposition method, a sputtering method, a reactive sputtering method, a molecular beam epitaxy method, a cluster ion beam method, an ion plating method, a plasma polymerization method, an atmospheric-pressure plasma polymerization method, a plasma CVD method, a laser CVD method, a thermal CVD method, a coating method, and the like can be used.

Among them, a barrier layer is preferable in which polysilazane having the structure represented by General Formula (A) described below is applied onto the base material by a coating method, and is subjected to a heating treatment in a range of 50° C. to 200° C., and then, is subjected to a reforming treatment with vacuum ultraviolet light by using a rare gas excimer lamp (for example, a Xe excimer lamp, MODEL: MECL-M-1-200, manufactured by M. D. COM. inc.) or the like, having an irradiation wavelength of approximately 172 nm. The thickness of the barrier layer can be suitably set according to the object, and in general, can be in a range of 10 nm to 10 μm.

$$—[Si(R^1)(R^2)—N(R^3)]— \qquad \text{General Formula (A)}$$

[In General Formula (A) described above, $R^1$, $R^2$, and $R^3$ each independently represent a hydrogen atom, an alkyl group, an alkenyl group, a cycloalkyl group, an aryl group, an alkyl silyl group, an alkyl amino group, or an alkoxy group.]

Polysilazane in which all of $R^1$, $R^2$, and $R^3$ in General Formula (A) described above are a hydrogen atom, is perhydropolysilazane. Perhydropolysilazane is preferable from the viewpoint of obtaining a dense film.

Examples of a forming method of the coated film include a roll coat method, a flow coat method, a spray coat method, a print method, a dip coat method, a bar coat method, a casting film formation method, an ink jet method, a gravure printing method, and the like.

In the preparation of the coating liquid, it is preferable to avoid the use of an alcohol-based organic solvent which easily reacts with polysilazane or an organic solvent having moisture. Therefore, examples of the organic solvent, which can be used for preparing the coating liquid, include a hydrocarbon solvent such as aliphatic hydrocarbon, alicyclic hydrocarbon, an aromatic hydrocarbon, a halogenated hydrocarbon solvent, ethers such as aliphatic ether and alicyclic ether, and the like. Specifically, hydrocarbons such as pentane, hexane, cyclohexane, toluene, xylene, Solvesso, and Turpen, halogen hydrocarbons such as methylene chloride and trichloroethane, ethers such as dibutyl ether, dioxane, and tetrahydrofuran, and the like are included. The organic solvent may be selected according to properties such as a solubility of polysilazane or an evaporation rate of the organic solvent, and a plurality of organic solvents may be mixed.

A commercially available product in which polysilazane is dissolved in the organic solvent can be used as the coating liquid. Examples of the commercially available product, which can be used, include AQUAMICANAX120-20, NN110, NN310, NN320, NL110A, NL120A, NL150A, NP110, NP140, SP140, manufactured by AZ Electronic Materials plc., and the like.

An illuminance of vacuum ultraviolet light can be in a range of 1 mW/cm$^2$ to 10 W/cm$^2$. In a case where the illuminance is greater than or equal to 1 mW/cm$^2$, a reforming efficiency is improved, and in a case where the illuminance is less than or equal to 10 W/cm$^2$, it is possible to reduce abrasion which is capable of occurring on the coated film, a damage on the resin base material, or the like.

An irradiation energy amount (irradiation dose) of vacuum ultraviolet light can be in a range of 0.1 J/cm$^2$ to 10.0 J/cm$^2$. According to the range, it is possible to prevent the occurrence of a crack due to excessive reforming, thermal deformation of the resin base material, or the like, and the productivity is also improved.

[2.2] Positive Electrode

A positive electrode using a metal, an alloy, an electric conductive compound, having a large work function (greater than or equal to 4 eV), and a mixture thereof as an electrode substance is preferably used as the positive electrode. A specific example of the electrode substance, which is capable of configuring the positive electrode, includes a metal such as gold and silver, and a conductive transparent material such as CuI, indium oxide tin (ITO), SnO$_2$, and ZnO. In addition, it is also preferable to use the metal oxide, and examples of the metal oxide include indium oxide.zinc oxide (IZO), indium oxide doped with gallium (IGO), indium oxide.tin oxide (IWZO), zinc oxide (ZnO), zinc oxide doped with Ga (GZO), indium.gallium.zinc oxide (IGZO), and the like.

In particular, IZO, IGO, and IWZO are preferable as the metal oxide. Among them, it is preferable that IZO has a composition represented by a mass ratio of $In_2O_3:ZnO=80$ to 95:5 to 20. It is preferable that IGO has a composition represented by a mass ratio $In_2O_3:Ga_2O_3=70$ to 95:5 to 30. It is preferable that IWZO has a composition represented by a $In_2O_3:WO_3:ZnO=95$ to 99.8:0.1 to 2.5:0.1 to 2.5.

In the transparent organic EL element, transparency of the electrode is extremely important, and thus, the metal oxide is particularly preferable, and an amorphous metal oxide which is capable of corresponding to a flexible base material is most preferable.

In the positive electrode, a thin film is formed of the electrode substance by a method such as vapor deposition or sputtering, a pattern having a desired shape may be formed by a photolithography method, or in a case where a pattern accuracy is not required (approximately greater than or equal to 100 μm), the pattern may be formed through a mask having a desired shape at the time of vapor deposition or sputtering of the electrode substance.

In a case of using a substance which can be applied, such as an organic conductive compound, it is possible to use a wet film formation method such as a printing method and a coating method. In a case where light is led out from the positive electrode side, it is desirable that a transmittance is greater than 50%. In addition, it is preferable that the positive electrode has sheet resistance of less than or equal to several hundred Ω/sq. A film thickness depends on the material, and in general, is selected from a range of 10 nm to 1000 nm, and is preferably selected from a range of 10 nm to 200 nm.

In addition, in the present invention, silver or an alloy containing silver can be used in the positive electrode.

In a case where the positive electrode is configured of the alloy containing silver, examples of the alloy include silver.magnesium (Ag.Mg), silver.copper (Ag.Cu), silver.palladium (Ag.Pd), silver.palladium.copper (Ag.Pd.Cu), silver.indium (Ag.In), and the like.

In the present invention, in a case where the positive electrode is a transparent positive electrode configured by containing silver as a main component, setting silver as a main component indicates that the content of silver in the positive electrode is greater than or equal to 60 mass %, and the content is preferably greater than or equal to 80 mass %, is more preferably greater than or equal to 90 mass %, and is particularly preferably greater than or equal to 98 mass %. In addition, "transparent" indicates that a light transmittance at a wavelength of 550 nm is greater than or equal to 50%.

In addition, a sheet resistance value of the positive electrode is preferably less than or equal to several hundred Ω/square, a thickness depends on the material, and in general, is in a range of 5 nm to 1 μm, and is preferably in a range of 5 nm to 200 nm. In addition, in a case where the positive electrode is configured by containing silver as a main component, the thickness is preferably in a range of 2 nm to 20 nm, and is more preferably in a range of 4 nm to 12 nm. It is preferable that the thickness is less than or equal to 20 nm, since the absorption component and the reflection component of emission light due to the positive electrode are suppressed to be low, and a high light transmittance is maintained.

In addition, in the present invention, in a case where the positive electrode is configured by containing silver as a main component, it is preferable that an underlayer is disposed under the positive electrode, from the viewpoint of increasing homogeneity of the silver layer. The underlayer is not particularly limited, and a layer containing an organic compound having a nitrogen atom or a sulfur atom is preferable, and a method of forming the silver layer on the underlayer is a preferred aspect.

[2.3] Light Emitting Layer

It is preferable that the light emitting layer configuring the organic EL element has a configuration in which a phosphorescent light emitting compound is contained as a light emitting material.

The light emitting layer is a layer in which an electron injected from the electrode or the electron transporting layer and a hole injected from the hole transporting layer are rebonded to each other, and thus, light is emitted, and a portion emitting light may be in the light emitting layer, or may be an interface between the light emitting layer and the adjacent layer.

The configuration of the light emitting layer is not particularly limited insofar as the light emitting material to be included satisfies a light emitting requirement. In addition, the light emitting layer may be a plurality of layers having the same light emission spectrum or light emission maximum wavelength layer. In this case, it is preferable that an interlayer having non-light emission properties is provided between the respective light emitting layers.

The sum of the thicknesses of the light emitting layers is preferably in a range of 1 nm to 100 nm, and is more preferably in a range of 1 nm to 30 nm from the viewpoint of being capable of obtaining a low driving voltage. Furthermore, in a case where the interlayer having non-light emission properties is provided between the light emitting layers, the sum of the thicknesses of the light emitting layers also includes the thickness of the interlayer.

The light emitting layer as described above can be formed of a light emitting material or a host compound described below, for example, by a known method such as a vacuum vapor deposition method, a spin coat method, a cast method, a Langmuir Blodgett method (an LB method), and an ink jet method.

In addition, in the light emitting layer, a plurality of light emitting materials may be mixed, or a phosphorescent light emitting material and a fluorescent light emitting material (also referred to as a fluorescent dopant and a fluorescent compound) may be used by being mixed in the same light emitting layer. In the configuration of the light emitting layer, it is preferable that the host compound (also referred to as a light emitting host or the like) and the light emitting material (also referred to as a light emitting dopant compound) are contained, and light is emitted from the light emitting material.

[2.3.1] Host Compound

A compound in which a phosphorescent quantum yield of phosphorescent light at a room temperature (25° C.) is less than 0.1, is preferable as the host compound contained in the light emitting layer. Further, it is preferable that the phosphorescent quantum yield is less than 0.01. In addition, in the compound contained in the light emitting layer, it is preferable that a volume ratio of the host compound in the layer is greater than or equal to 50%.

A known host compound may be independently used, or a plurality of types of host compounds may be used by being mixed, as the host compound. By using a plurality of types of host compounds, it is possible to adjust charge movement, and to increase the efficiency of the organic EL element. In addition, by using a plurality of light emitting materials described below, it is possible to mix different emission light rays, and thus, it is possible to obtain an arbitrary light emission color.

The host compound, which is used in light emitting layer may be a known low molecular compound of the related art, may be a polymer compound having a repeating unit, or may be a low molecular compound having a polymerizable group such as a vinyl group or an epoxy group (a vapor deposition polymerizable light emitting host).

Examples of the host compound, which can be applied to the present invention, are capable of including compounds described in JP 2001-257076 A, JP 2001-357977 A, JP 2002-8860 A, JP 2002-43056 A, JP 2002-105445 A, JP 2002-352957 A, JP 2002-231453 A, JP 2002-234888 A, JP 2002-260861 A, JP 2002-305083 A, US 2005/0112407 A, US 2009/0030202 A, WO 2001/039234 A, WO 2008/056746 A, WO 2005/089025 A, WO 2007/063754 A, WO 2005/030900 A, WO 2009/086028 A, WO 2012/023947 A, JP 2007-254297 A, EP 2034538 B, and the like.

[2.3.2] Light Emitting Material

Examples of the light emitting material, which can be used in the present invention, include a phosphorescent light emitting compound (also referred to as a phosphorescent compound, a phosphorescent light emitting material, or a phosphorescent light emitting dopant) and a fluorescent light emitting compound (also referred to as a fluorescent compound or a fluorescent light emitting material).

<Phosphorescent Light Emitting Compound>

The phosphorescent light emitting compound is defined as a compound in which light emission from an excited triplet is observed, and specifically, a compound which emits phosphorescent light at a room temperature (25° C.), and a compound in which a phosphorescent quantum yield is greater than or equal to 0.01 at 25° C., but a preferred phosphorescent quantum yield is greater than or equal to 0.1.

The phosphorescent quantum yield described above can be measured by a method described in 4th Edition Experimental Chemistry Course 7, Light II, p. 398 (1992, published by MaruzenJunkudo Bookstores Co., Ltd.). The phosphorescent quantum yield in a solution can be measured by using various solvents, but in the present invention, in a case of using the phosphorescent light emitting compound, the phosphorescent quantum yield of greater than or equal to 0.01 may be attained in an arbitrary solvent.

The phosphorescent light emitting compound can be used by being suitably selected from known components which are used in a light emitting layer of a general organic EL element, and is preferably a complex-based compound containing metals of groups 8 to 10 in a periodic table of elements, is more preferably an iridium compound, an osmium compound, a platinum compound (a platinum complex-based compound), or a rare earth complex, and among them, the iridium compound is most preferable.

In the present invention, at least one light emitting layer may contain two or more types of phosphorescent light emitting compounds, or may have an aspect in which a concentration ratio of the phosphorescent light emitting compound in the light emitting layer is changed in a thickness direction of the light emitting layer.

A specific example of a known phosphorescent light emitting compound, which can be used in the present invention, include compounds or the like described in the following literatures.

Compounds described in Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991 A, WO 2008/101842 A, WO 2003/040257 A, US 2006/835469 A, US 2006/0202194 A, US 2007/0087321 A, US 2005/0244673 A can be included.

In addition, compounds described in Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290 A, WO 2009/000673 A, U.S. Pat. No. 7,332,232, US 2009/0039776 A, U.S. Pat. No. 6,687,266, US 2006/0008670 A, US 2008/0015355 A, U.S. Pat. No. 7,396,598, US 2003/0138657 A, U.S. Pat. No. 7,090,928, and the like can be included.

In addition, compounds described in Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2006/056418 A, WO 2005/123873 A, WO 2005/123873 A, WO 2006/082742 A, US 2005/0260441 A, U.S. Pat. No. 7,534,505, US 2007/0190359 A, U.S. Pat. Nos. 7,338,722, 7,279,704, US 2006/103874 A, and the like can also be included.

Further, compounds described in WO 2005/076380 A, WO 2008/140115 A, WO 2011/134013 A, WO 2010/086089 A, WO 2012/020327 A, WO 2011/051404 A, WO 2011/073149 A, JP 2009-114086 A, JP 2003-81988 A, JP 2002-363552 A, and the like, can also be included.

In the present invention, examples of a preferred phosphorescent light emitting compound include an organic metal complex having Ir in a center metal. A complex having at least one coordination manner of a metal-carbon bond, a metal-nitrogen bond, a metal-oxygen bond, and a metal-sulfur bond is more preferable.

The phosphorescent light emitting compound (also referred to as a phosphorescent light emitting metal complex), for example, can be synthesized by using methods disclosed in Organic Letter magazine, vol 3, No. 16, 2579-2581 (2001), Inorganic Chemistry, Vol. 30, No. 8, 1685-1687 (1991), J. Am. Chem. Soc. Vol. 123, page 4304 (2001), Inorganic Chemistry, Vol. 40, No. 7, pp. 1704-1711 (2001), Inorganic Chemistry, Vol. 41, No. 12, pp. 3055-3066 (2002), New Journal of Chemistry., Vol. 26, page 1171 (2002), and European Journal of Organic Chemistry, Volume 4, 695-709 (2004), reference literatures described in such literatures, and the like.

<Fluorescent Light Emitting Compound>

Examples of the fluorescent light emitting compound include a coumarin-based pigment, a pyran-based pigment, a cyanine-based pigment, a croconium-based pigment, a squalium-based pigment, an oxobenzanthracene-based pigment, a fluorescein-based pigment, a rhodamine-based pigment, a pyrylium-based pigment, a perylene-based pigment, a stilbene-based pigment, a polythiophene-based pigment, a rare earth complex-based fluorescent body, or the like.

[2.4] Injecting Layer, Transporting Layer, and Inhibiting Layer

[2.4.1] Hole Injecting Layer and Electron Injecting Layer

The injecting layer is a layer which is disposed between the electrode and the light emitting layer in order to improve a decrease in a driving voltage or a light emission brightness, and the details thereof are described in Chapter 2 "Electrode Materials" (pages 123 to 166) of Chapter 2 of "Organic EL Element and its Industrialization Front Line (Nov. 30, 1998, published by NTS Inc.)". In general, it is possible to allow the hole injecting layer to exist between the positive electrode and the light emitting layer or the hole transporting layer, and the electron injecting layer to exist between the negative electrode and the light emitting layer or the electron transporting layer.

The details of the hole injecting layer are also described in JP 9-45479 A, JP 9-260062 A, JP 8-288069 A, and the like, and examples of a material used in the hole injecting layer include a porphyrin derivative, a phthalocyanine derivative, an oxazole derivative, an oxadiazole derivative, a triazole derivative, an imidazole derivative, a pyrazoline derivative, a pyrazolone derivative, a phenylene diamine derivative, a hydrazone derivative, a stilbene derivative, a polyaryl alkane derivative, a triaryl amine derivative, a carbazole derivative, an indolocarbazole derivative, an isoindole derivative, an acene-based derivative such as anthracene or naphthalene, a fluorene derivative, a fluorenone derivative, a polyvinyl carbazole, a polymer material or an oligomer in which aromatic amine is introduced into a main chain or a side chain, polysilane, a conductive polymer or an oligomer (for example, polyethylene dioxythiophene (PEDOT):polystyrene sulfonic acid (PSS), an aniline-based copolymer, polyaniline, polythiophene, and the like), and the like.

Examples of the triaryl amine derivative include a benzidine type compound represented by 4,4'-bis[N-(1-naphthyl)-N-phenyl amino] biphenyl (α-NPD), a starburst type compound represented by 4,4',4''-tris[N-(3-methyl phenyl)-N-phenyl amino] triphenyl amine (MTDATA), a compound having fluorene or anthracene in a triaryl amine coupling core portion, and the like.

A layer thickness of the hole injecting layer is not particularly limited, and in general, is in a range of approximately 0.1 nm to 100 nm, is preferably in a range of 2 nm to 50 nm, and is more preferably in a range of 2 nm to 30 nm.

The details of the electron injecting layer are also described in JP 6-325871 A, JP 9-17574 A, JP 10-74586 A, and the like, and a specific example of a material preferably used in the electron injecting layer includes a metal represented by strontium, aluminum, or the like, an alkali metal compound represented by lithium fluoride, sodium fluoride, potassium fluoride, or the like, an alkali metal halide layer represented by magnesium fluoride, calcium fluoride, or the like, an alkali earth metal compound layer represented by magnesium fluoride, a metal oxide represented by molybdenum oxide, aluminum oxide, or the like, a metal complex represented by lithium 8-hydroxy quinolate (Liq) or the like, and the like.

It is desirable that the electron injecting layer is an extremely thin film, a layer thickness thereof depends on a configuration material, and it is preferable that the layer thickness is in a range of 1 nm to 10 μm.

[2.4.2] Hole Transporting Layer and Electron Transporting Layer

The hole transporting layer is formed of a hole transporting material having a function of transporting a hole, and in a broad sense, the hole injecting layer and the electron inhibiting layer also have the function of the hole transporting layer. The hole transporting layer can be disposed as a single layer or a plurality of layers.

The hole transporting material has any one of injecting or transporting of the hole and barrier properties of the electron, and may be any one of an organic substance and an inorganic substance. Examples of the hole transporting material include a triazole derivative, an oxadiazole derivative, an imidazole derivative, a polyaryl alkane derivative, a pyrazoline derivative, a pyrazolone derivative, a phenylene diamine derivative, an aryl amine derivative, an amino-substituted chalcone derivative, an oxazole derivative, a styryl anthracene derivative, a fluorenone derivative, a hydrazone derivative, a stilbene derivative, a silazane derivative, an aniline-based copolymer, a conductive polymer oligomer, a thiophene oligomer, and the like.

The materials described above can be used as the hole transporting material, a porphyrin compound, an aromatic tertiary amine compound, and a styryl amine compound can be used, and it is particularly preferable to use the aromatic tertiary amine compound.

A representative example of the aromatic tertiary amine compound and the styryl amine compound includes N,N,N',N'-tetraphenyl-4,4'-diaminophenyl, N,N'-diphenyl-N,N'-bis(3-methyl phenyl)-[1,1'-biphenyl]-4,4'-diamine (simply referred to as TPD), 2,2-bis(4-di-p-tolyl aminophenyl) propane, 1,1-bis(4-di-p-tolyl aminophenyl) cyclohexane, N,N,N',N'-tetra-p-tolyl-4,4'-diaminobiphenyl, 1,1-bis(4-di-p-tolyl aminophenyl)-4-phenyl cyclohexane, bis(4-dimethyl amino-2-methyl phenyl) phenyl methane, bis(4-di-p-tolyl aminophenyl) phenyl methane, N,N'-diphenyl-N,N'-di(4-methoxy phenyl)-4,4'-diaminobiphenyl, N,N,N',N'-tetraphenyl-4,4'-diaminodiphenyl ether, 4,4'-bis(diphenyl amino) quadri-phenyl, N,N,N-tri(p-tolyl) amine, 4-(di-p-tolyl amino)-4'-[4-(di-p-tolyl amino)styryl] stilbene, 4-N,N-diphenyl amino-(2-diphenyl vinyl) benzene, 3-methoxy-4'-N,N-diphenyl aminostilbenzene, N-phenyl carbazole, and the like.

The hole transporting layer can be formed by thinning the hole transporting material described above, for example, according to a known method such as a vacuum vapor deposition method, a spin coat method, a cast method, a printing method including an ink jet method, and a Langmuir Blodgett method (an LB method). A layer thickness of the hole transporting layer is not particularly limited, and in general, is in a range of approximately 5 nm to 5 μm, and is preferably in a range of 5 nm to 200 nm. The hole transporting layer may have a one-layer structure formed of one type or two or more types of the materials described above.

In addition, the material of the hole transporting layer is doped with impurities, and thus, it is possible to improve p properties. Examples of the material include materials described in JP 4-297076 A, JP 2000-196140 A, JP 2001-102175 A, J. Appl. Phys., 95, 5773 (2004), and the like.

Thus, it is preferable to increase the p properties of the hole transporting layer, since it is possible to prepare an organic EL element having lower power consumption.

The electron transporting layer is configured of a material having a function of transporting an electron, and in a broad sense, the electron injecting layer and the hole inhibiting layer are also included in the electron transporting layer. The electron transporting layer can be disposed as a single layer structure or a laminate structure of a plurality of layers.

In the electron transporting layer of a single layer structure and the electron transporting layer of a laminate structure, it is preferable that an electron transporting material configuring a layer portion adjacent to the light emitting layer (also functions as a hole inhibiting material) has a function of transporting an electron injected from the cathode to the light emitting layer. An arbitrary material can be used by being selected from known compounds of the related art, as the material described above. Examples of the material described above include a nitro-substituted fluorene derivative, a diphenyl quinone derivative, a thiopyran dioxide derivative, carbodiimide, a fluorenylidene methane derivative, anthraquinodimethane, an anthrone derivative, an oxadiazole derivative, and the like. Further, in the oxadiazole derivative described above, a thiadiazole derivative in which an oxygen atom of an oxadiazole ring is substituted with a sulfur atom, and a quinoxaline derivative which has a quinoxaline ring known as an electron withdrawing group can also be used as the material of the electron transporting layer. Further, a polymer material in which such materials are introduced into a polymer chain or a polymer material in which such materials are contained as a main chain of the polymer can be used.

In addition, a metal complex of a 8-quinolinol derivative, for example, tris(8-quinolinol) aluminum (simply referred to as Alq$_3$), tris(5,7-dichloro-8-quinolinol) aluminum, tris(5,7-dibromo-8-quinolinol) aluminum, tris(2-methyl-8-quinolinol) aluminum, tris(5-methyl-8-quinolinol) aluminum, bis(8-quinolinol) zinc (simply referred to as Znq), and the like, and a metal complex in which a center metal of the metal complex is substituted with In, Mg, Cu, Ca, Sn, Ga, or Pb, can also be used as the material of the electron transporting layer.

The electron transporting layer can be formed by thinning the material described above, for example, according to a known method such as a vacuum vapor deposition method, a spin coat method, a cast method, a printing method including an ink jet method, and an LB method. A layer thickness of the electron transporting layer is not particularly limited, and in general, is in a range of approximately 5 nm to 5 μm, and is preferably in a range of 5 nm to 200 nm. The electron transporting layer may have a single structure of one type or two or more types of the materials described above.

[2.4.3] Inhibiting Layer

Examples of the inhibiting layer include the hole inhibiting layer and the electron inhibiting layer, and the inhibiting layer is a layer which is disposed as necessary, in addition to each layer of the organic EL element described above. Examples of the inhibiting layer are capable of including a hole inhibiting (hole blocking) layer and the like described in JP 11-204258 A, JP 11-204359 A, page 237 of "Organic EL Element and its Industrialization Front Line (Nov. 30, 1998, published by NTS Inc.)", and the like.

The hole inhibiting layer, in a broad sense, has the function of the electron transporting layer. The hole inhibiting layer is formed of a hole inhibiting material having a function of rarely transporting a hole while having a function of transporting an electron, and inhibits the hole while transporting the electron, and thus, it is possible to improve recoupling probability between the electron and the hole. In addition, the configuration of the electron transporting layer can be used as the hole inhibiting layer, as necessary. It is preferable that the hole inhibiting layer is disposed to be adjacent to the light emitting layer.

On the other hand, the electron inhibiting layer, in a broad sense, has the function of the hole transporting layer. The electron inhibiting layer is formed of a material having a function of rarely transporting an electron while having a function of transporting a hole, and inhibits the electron while transporting the hole, and thus, it is possible to improve the recoupling probability between the electronic and the hole. In addition, the configuration of the hole transporting layer can be used as the electron inhibiting layer, as necessary.

A layer thickness of the hole inhibiting layer according to the present invention is preferably in a range of 3 nm to 100 nm, and is more preferably in a range of 5 nm to 30 nm.

[2.5] Negative Electrode

The negative electrode is an electrode film which functions for supplying a hole to an organic functional layer group or the light emitting layer, and a metal having a small work function (less than or equal to 4 eV) (referred to as an electron injecting metal), an alloy, an electric conductive compound, and a mixture thereof are used as an electrode substance. Specifically, examples of the material include gold, aluminum, silver, magnesium, lithium, a magnesium/copper mixture, a magnesium/silver mixture, a magnesium/aluminum mixture, a magnesium/indium mixture, indium, a lithium/aluminum mixture, a rare earth metal, an oxide semiconductor such as ITO, ZnO, TiO$_2$, and SnO$_2$, a combination/a laminate thereof, and the like.

In addition, it is also preferable to use a metal oxide, and examples of the metal oxide include indium oxide.zinc oxide (IZO), indium oxide doped with gallium (IGO), indium oxide.tin oxide (IWZO), zinc oxide (ZnO), zinc oxide doped with Ga (GZO), indium.gallium.zinc oxide (IGZO), and the like.

In particular, IZO, IGO, and IWZO are preferable as the metal oxide. Among them, it is preferable that IZO has a composition represented by a mass ratio of In$_2$O$_3$:ZnO=80 to 95:5 to 20. It is preferable that IGO has a composition represented by a mass ratio In$_2$O$_3$:Ga$_2$O$_3$=70 to 95:5 to 30. It is preferable that IWZO has a composition represented by a In$_2$O$_3$:WO$_3$:ZnO=95 to 99.8:0.1 to 2.5:0.1 to 2.5.

In the transparent organic EL element, the transparency of the electrode is extremely important, and thus, the metal oxide is particularly preferable, and an amorphous metal oxide which is capable of corresponding to a flexible base material is most preferable. In addition, in the negative electrode, a metal thin film is also preferable from a relationship of a work function, and a thin film/a laminated film/a composite film containing silver as a main component are preferable.

The negative electrode can be prepared by thinning such a conductive material according to a method such as vapor deposition and sputtering. In addition, sheet resistance of the negative electrode is preferably less than or equal to several hundred Ω/sq., and a thickness also depends on the material, but in general, is in a range of 5 nm to 5 μm, and is preferably in a range of 5 nm to 200 nm.

A film thickness of the negative electrode, in general, is selected from a range of 10 nm to 5 μm, and is preferably selected from a range of 50 nm to 200 nm. In addition, the negative electrode is prepared by the metal described above to have a film thickness of 1 nm to 20 nm, and thus, it is possible to prepare a transparent negative electrode, and according to this, it is possible to prepare an element in which both of the positive electrode and the negative electrode have transmission properties.

[2.6] Other Functional Layers

<Optical Adjustment Layer>

The material of the optical adjustment layer is not particularly limited insofar as a suitable refractive index can be obtained, and an existing compound can be used. A compound which can be subjected to vacuum film formation is preferable from the viewpoint of being capable of forming a film on the electrode of the organic EL without any damage. In particular, a compound which can be subjected to heating vapor deposition or EB vapor deposition is preferable.

For example, Al$_2$O$_3$ (a refractive index of 1.6), CeO$_3$ (a refractive index of 2.2), Ga$_2$O$_3$ (a refractive index of 1.5), HfO$_2$ (a refractive index of 2.0), indium tin oxide (ITO, a refractive index of 2.1), indium zinc oxide (a refractive index of 2.1), MgO (a refractive index of 1.7), Nb$_2$O$_5$ (a refractive index of 2.3), SiO$_2$ (a refractive index of 1.5), Ta$_2$O$_5$ (a refractive index of 2.2), TiO$_2$ (a refractive index of 2.3 to 2.5), Y$_2$O$_3$ (a refractive index of 1.9), ZnO (a refractive index of 2.1), $ZrO_2$ (a refractive index of 2.1), $AlF_3$ (1.4), $CaF_2$ (1.2 to 1.4), $CeF_3$ (1.6), $GdF_3$ (1.6), $LaF_3$ (1.59), LiF (1.3), $MgF_2$ (1.4), NaF (1.3), and the like can be used.

A layer thickness can be suitably adjusted, and the layer thickness of the optical adjustment layer is preferably 10 nm to 500 nm, is more preferably 20 nm to 250 nm, and is even more preferably 30 nm to 150 nm, from the viewpoint of improving the transmittance.

<Antistatic Layer>

In the transparent conductive member, it is preferable that the antistatic layer is provided on one surface of the resin base material. The antistatic layer is configured of an antistatic agent, and a binder resin for retaining the antistatic agent.

It is preferable that the antistatic layer contains an organic antistatic agent as the antistatic agent. It is preferable that the organic antistatic agent contained in the antistatic layer contains one type of polymer selected from a conjugated polymer and an ionic polymer. In addition, the antistatic layer may be configured by containing other conductive polymers or antistatic agents.

In the antistatic layer, it is preferable to use the organic antistatic agent, and the organic antistatic agent is basically configured of an organic material having antistatic performance. When the antistatic layer is formed, the organic antistatic agent is a material which is capable of setting a sheet resistance value of the antistatic layer on a rear surface side to be less than or equal to $1 \times 10^{11}$ $\Omega$/sq., to be preferably less than or equal to $1 \times 10^{10}$ $\Omega$/sq., and to be more less than or equal to $1 \times 10^9$ $\Omega$/sq.

Examples of the organic antistatic agent are capable of including a known surfactant type antistatic agent of the related art, a silicone-based antistatic agent, an organic boric acid-based antistatic agent, a polymer-based antistatic agent, an antistatic polymer material, and the like. In particular, it is preferable to use an ion conductive substance and the like as the organic antistatic agent, from the viewpoint of antistatic properties of the antistatic layer. The ion conductive substance is a substance containing an ion exhibiting electric conductivity. Examples of the ion conductive substance are capable of including a known conjugated polymer or ionic polymer.

[2.7] Manufacturing Method of Organic EL Element

In a manufacturing method of the organic EL element, the positive electrode, the first carrier functional layer group, the light emitting layer, the second carrier functional layer group, and the negative electrode are laminated on the transparent base material, and thus, a laminate is formed.

First, the transparent base material is prepared, and the positive electrode according to the present invention is formed on the transparent base material. Simultaneously, the first lead-out electrode portion of the present invention, which is connected to the external power source, is formed in an end portion of the positive electrode, as a connection electrode portion.

Next, the hole injecting layer and the hole transporting layer configuring the first carrier functional layer group, the light emitting layer, the electron transporting layer configuring the second carrier functional layer group, and the like are laminated on the first lead-out electrode portion, in this order.

For example, a spin coat method, a cast method, an ink jet method, a vapor deposition method, a printing method, and the like are used as a forming method of each of the layers, and the vacuum vapor deposition method or the spin coat method is particularly preferable from the viewpoint of easily obtaining a homogeneous layer and of preventing the occurrence of a pinhole. Further, a different forming method may be applied to each of the layers. In a case where the vapor deposition method is adopted for forming each of the layers, a vapor deposition condition is different according to the type of compound to be used or the like, in general, a boat heating temperature is 50° C. to 450° C., a vacuum degree is $1 \times 10^{-6}$ Pa to $1 \times 10^{-2}$ Pa, a vapor deposition rate is 0.01 nm/second to 50 nm/second, a substrate temperature is −50° C. to 300° C., a layer thickness is in a range of 0.1 μm to 5 μm, and it is desirable that each condition is suitably selected.

As described above, the first carrier functional layer group, the light emitting layer, and the second carrier functional layer group are formed, and then, the negative electrode is formed. At this time, the negative electrode has a pattern in the shape where the first lead-out electrode portion of the present invention is drawn out to the vicinity of a sealing end portion of the transparent substrate from the upper portion of the second carrier functional layer group while an insulating state with respect to the positive electrode is maintained by the organic functional layer group.

Next, the second lead-out electrode portion is connected to the first lead-out electrode portion of the present application.

A Mo/Al.Nd Alloy/Mo (MAM) electrode having a three-layer structure, a metal oxide thin film such as such as indium oxide.zinc oxide (IZO), indium oxide doped with gallium (IGO), indium oxide.tin oxide (IWZO), zinc oxide (ZnO), zinc oxide doped with Ga (GZO), and indium.gallium.zinc oxide (IGZO), and the like can be used in the second lead-out electrode portion, and it is preferable to use the MAM electrode from the viewpoint of the durability.

The first lead-out electrode portion exists only in the sealing layer, and it is preferable that the first lead-out electrode portion is connected to the second lead-out electrode portion having a planar structure, such as the MAM electrode described above, in the pass portion inside and outside the sealing layer, from the viewpoint of the adhesiveness with respect to the sealing material. Here, the "planar structure" indicates that the shape of the electrode is planar, and a rapezoidal shape, a semicylindrical shape, a rectangular shape, and the like are preferable as the shape.

As described above, the transparent organic EL element of the present invention can be manufactured.

The negative electrode is formed, and then, the organic EL element portion configured of the positive electrode, the first carrier functional layer group, the light emitting layer, the second carrier functional layer group, the negative electrode, and the lead-out electrode portion are sealed on the transparent base material by using sealing means.

[3] Sealing

Examples of the sealing means used for sealing the organic EL element portion and the lead-out electrode portion are capable of including a method of allowing a sealing member to adhere onto the transparent base material with an adhesive agent.

The sealing member may be disposed to cover the organic EL element portion and the first lead-out electrode portion, and may be in the shape of a concave plate, or may be in a planar shape. In addition, a sealing member having the same degree of transparency as that of the transparent base material is preferable as the sealing member.

Specifically, a glass plate, a polymer plate, a film, a metal plate, a film, and the like are included. In particular, examples of the glass plate are capable of including soda lime glass, barium.strontium-containing glass, lead glass, aluminosilicate glass, borosilicate glass, barium borosilicate glass, quartz, and the like. In addition, examples of the polymer plate are capable of including polycarbonate, acryl, polyethylene terephthalate, polyether sulfide, polysulfon, and the like. Examples of the metal plate include one or more types of metals selected from the group consisting of stainless steel, iron, copper, aluminum, magnesium, nickel, zinc, chromium, titanium, molybdenum, silicon, germanium, and tantalum, and alloys.

A resin film with a gas barrier layer can be preferably used as the sealing member from the viewpoint of making the organic EL element thin and transparent. The materials described as the transparent base material described above are preferably used as the resin film.

In the resin film with a gas barrier layer, a moisture vapor permeability at a temperature of 25±0.5° C. and relative humidity of 90±2% RH, measured by a method based on JIS K 7129-1992, is preferably less than or equal to $1 \times 10^{-3}$ g/m$^2$·24 h, an oxygen permeability measured by a method based on JIS K 7126-1987 is less than or equal to $1 \times 10^{-3}$ mL/m$^2$·24 h·atm (1 atm is $1.01325 \times 10^5$ Pa), and it is preferable that a moisture vapor permeability at a temperature of 25±0.5° C. and relative humidity of 90±2% RH is less than or equal to $1 \times 10^{-3}$ g/m$^2$·24 h.

It is preferable that inert gas such as nitrogen and argon, fluorohydrocarbon, and an inert liquid such as silicon oil are injected into a gap between the sealing member and a display region of the organic EL element (the light emitting region), in a gas phase and a liquid phase. In addition, it is possible to set the gap between the sealing member and the display region of the organic EL element to be in a vacuum state, or to seal the gap with a hygroscopic compound.

A suitable adhesive agent is used for sealing, and an adhesive agent layer is formed on the sealing member. A known adhesive agent for sealing of the related art can be used as a material configuring the adhesive agent layer, and for example, a thermal curable adhesive agent, an ultraviolet curable resin, or the like is used, and a thermal curable adhesive agent such as an epoxy-based resin, an acrylic resin, and a silicone resin is preferably used, and an epoxy-based thermal curable adhesive resin which has excellent humidity resistance and water resistance, and rarely contracts at the time of being cured is more preferably used. The thickness of the adhesive agent layer, for example, can be in a range of 10 µm to 30 µm.

EXAMPLES

Hereinafter, the present invention will be described in detail by using examples, but the present invention is not limited thereto. Furthermore, in the examples, "parts" or "%" indicates "parts by mass" or "mass %" unless otherwise noted.

[Preparation of Organic EL Element 101]
(Formation of Positive Electrode)

An ITO (In$_2$O$_3$:SnO$_2$=90:10 (a mass ratio)) film was formed by a sputtering method in a condition of having a thickness of 100 nm on a support substrate of transparent glass, and then, patterning was performed, and thus, an anode electrode formed of an ITO layer (a positive electrode) was formed. Next, the substrate provided with the ITO layer was subjected to ultrasonic washing with isopropyl alcohol, was subjected to drying with nitrogen gas, and was subjected to UV ozone washing for 5 minutes.

(Formation of Hole Injecting Layer to Electron Injecting Layer)

A support substrate provided with the ITO layer was fixed to a substrate holder of a commercially available vacuum vapor deposition device, α-NPD, a compound H4, a compound Ir-4, BAlq, Alq$_3$, and lithium fluoride were respectively put into resistance heating boats of tantalum, and the resistance heating boats were attached to a first vacuum tank of the vacuum vapor deposition device. Furthermore, the structures of the compound H4, the compound Ir-4, α-NPD, BAlq, and Alq$_3$ are as follows.

[Chemical Formula 3]

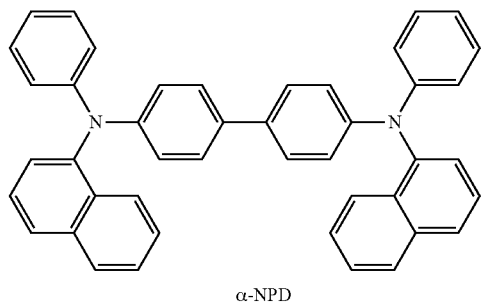

α-NPD

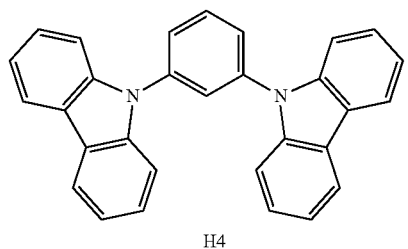

H4

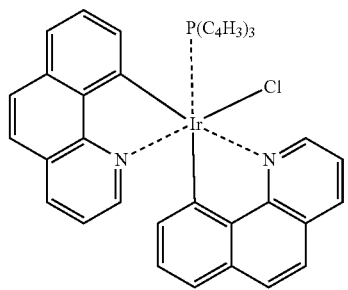

Ir-4

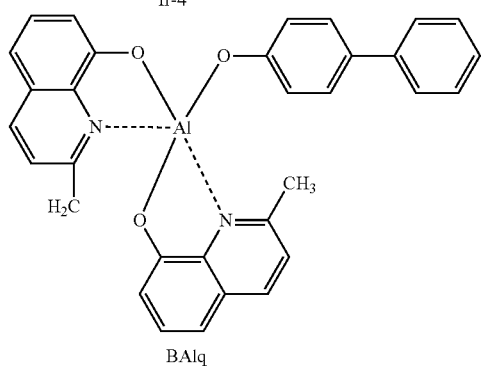

BAlq

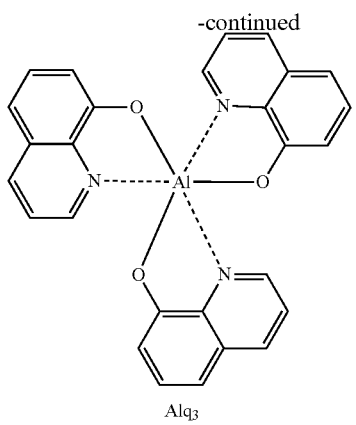

Alq₃

Further, silver was put into a resistance heating boat of tungsten, and the resistance heating boat was attached to a second vacuum tank of the vacuum vapor deposition device.

First, the first vacuum tank was depressurized up to $4 \times 10^{-4}$ Pa, and then, the heating boat containing α-NPD was energized and heated, a hole transporting layer having a film thickness of 20 nm, which also functions as a hole injecting layer, was disposed on the ITO layer at a vapor deposition rate of 0.1 to 0.2 nm/second.

Further, the heating boat containing the compound H4 and the heating boat containing the compound Ir-4 were independently energized, a vapor deposition rate of H4, which is a light emitting host, and Ir-4, which is a light emitting dopant, was adjusted to be 100:6, and thus, a light emitting layer having a film thickness of 30 nm was provided.

Next, the heating boat containing BAlq was energized and heated, and thus, a hole inhibiting layer having a film thickness of 10 nm was provided at a vapor deposition rate of 0.1 nm/second to 0.2 nm/second.

Further, the heating boat containing Alq₃ was energized and heated, and thus, an electron transporting layer having a film thickness of 20 nm was provided at a vapor deposition rate of 0.1 nm/second to 0.2 nm/second.

Further, the heating boat containing lithium fluoride was energized and heated, and thus, an electron injecting layer having a film thickness of 1 nm was provided at a vapor deposition rate of 0.01 nm/second to 0.02 nm/second.

(Formation of Negative Electrode)

Next, an element in which layers up to the electron injecting layer were formed, was moved to the second vacuum tank in a vacuum state, and the second vacuum tank was depressurized up to $4 \times 10^{-4}$ Pa, and then, the heating boat containing silver was energized and heated, and thus, a layer of silver having a film thickness of 10 nm was formed at a vapor deposition rate of 0.1 nm/second to 0.2 nm/second, and a cathode electrode (a negative electrode) was formed.

(Formation of Lead-out Electrode)

Molybdenum (Mo)/Aluminum (Al)/Molybdenum (Mo) (MAM) was formed to have a thickness of 150 nm and was connected to draw-out portions of the positive electrode and the negative electrode of the prepared element, as the first lead-out electrode portion of FIG. 1, and then, molybdenum (Mo)/Aluminum (Al)/Molybdenum (Mo) (MAM) was formed to have a trapezoidal sectional shape and was connected to the draw-out portions, as the second lead-out electrode portion.

(Sealing of Element)

Finally, the element obtained as described above was covered with a glass case, a glass substrate having a thickness of 300 μm was used as a substrate for sealing, an epoxy-based photocurable adhesive agent (Luxtrack LC0629B, manufactured by TOAGOSEI CO., LTD.), as a sealing material, was applied around the substrate, and as illustrated in FIG. 1, the second lead-out electrode portion and the support substrate of the element cohered together, were irradiated with UV light from the glass substrate side, and were cured and sealed, and thus, an organic EL element 101 was obtained.

[Preparation of Organic EL Element 102]

An organic EL element 102 was formed by the same method as that in the preparation of the lead-out electrode of the organic EL element 101, except that in the preparation of the first lead-out electrode portion, ITO was subjected to film formation by a sputtering method in a condition of having a thickness of 150 nm, and was set to the first lead-out electrode portion formed of an ITO layer.

[Preparation of Organic EL Element 103]

An organic EL element 103 was formed by the same method as that of the organic EL element 101, except that a thin metal line pattern described below was formed as the first lead-out electrode portion in the shape of a line by screen printing, and was covered with a mask sputter of ITO, and then, Molybdenum (Mo)/Aluminum (Al)/Molybdenum (Mo) (MAM) was formed as the second lead-out electrode portion, in the preparation of the lead-out electrode of the organic EL element 101.

In the formation of the thin metal line pattern, a screen printing plate pattern in which lines having a width of 50 μm were arranged with a pitch of 5 mm, was formed by a small thick film semi-automatic printer STF-150IP (manufactured by Tokai Shoji Co., Ltd.) using silver nanoparticle ink 1 (TEC-PA-010; manufactured by InkTec Co., Ltd.), and the thin metal line pattern was printed by a screen printing method such that a height of a fine line after being calcined became 1 μm.

A calcining treatment (a heat treatment at 120° C. for 30 minutes) was performed by a hot plate after the printing, and thus, the thin metal line pattern was prepared.

The size of the formed thin metal line pattern was measured by a non-contact three-dimensional front surface shape roughness meter WYKO NT9100 (manufactured by Veeco Instruments Inc.) with a high brightness a plurality of times by changing a position.

[Preparation of Organic EL Element 104]

An organic EL element 104 was formed by the same method as that in the preparation of the organic EL element 103, except that a thin metal line pattern in which lines having a width of 50 μm were arranged with a pitch of 200 μm, was formed as the first lead-out electrode portion by screen printing, in the preparation of the organic EL element 103.

[Preparation of Organic EL Element 105]

An organic EL element 105 was formed by the same method as that in the preparation of the organic EL element 103, except that a thin metal line pattern in which lines having a width of 30 μm were arranged with a pitch of 120 μm, was formed as the first lead-out electrode portion by ink jet printing described below, in the preparation of the organic EL element 103.

The ink jet printing was performed by using a desktop robot SHOTMASTER300 (manufactured by Musashi engineering, Inc.) provided with an ink jet head KM512SHX manufactured by Konica Minolta, Inc., and the robot was controlled by an ink jet evaluation device EB150 (manufactured by Konica Minolta, Inc.).

Irradiation with xenon light was performed by using PulseForge1300 manufactured by NovaCentrix and calcining was performed, after the coating, and thus, the fine line pattern was formed. The xenon light was emitted according to pulse light emission of 250 μs with a period of 500 μs, and irradiation dose was adjusted such that energy to be applied became 1500 mJ/cm².

[Preparation of Organic EL Element 106]

An organic EL element 106 was formed by the same method as that in the preparation of the organic EL element 105, except that a thin metal line pattern in which lines having a width of 10 μm were arranged with a pitch of 40 μm, was formed as the first lead-out electrode portion by the ink jet printing, in the preparation of the organic EL element 105.

[Preparation of Organic EL Element 107]

An organic EL element 107 was formed by the same method as that in the preparation of the organic EL element 105, except that a thin metal line pattern in which lines having a width of 50 μm were arranged with a pitch of 280 μm into the shape of a matrix-like grid, was formed as the first lead-out electrode portion by the ink jet printing, in the preparation of the organic EL element 105.

[Preparation of Organic EL Element 108]

An organic EL element 108 was formed by the same method as that in the preparation of the organic EL element 107, except that a thin metal line pattern in which lines having a width of 30 μm were arranged with a pitch of 170 μm into the shape of a matrix-like grid, was formed as the first lead-out electrode portion by the ink jet printing in the preparation of the organic EL element 107.

[Preparation of Organic EL Element 109]

An organic EL element 109 was formed by the same method as that in the preparation of the organic EL element 107, except that a thin metal line pattern in which lines having a width of 10 μm were arranged with a pitch of 60 μm into the shape of a matrix-like grid, was formed as the first lead-out electrode portion by the ink jet printing, in the preparation of the organic EL element 107.

[Preparation of Organic EL Element 110]

An organic EL element 110 was formed by the same method as that in the preparation of the organic EL element 107, except that a thin metal line pattern in which lines having a width of 50 μm were arranged with a pitch of 390 μm into the shape of a grid first, and then, into the shape of Grid+Cross in which lines in directions of 45° and 135° were added to the grid, was formed as the first lead-out electrode portion by the ink jet printing, in the preparation of the organic EL element 107.

[Preparation of Organic EL Element 111]

An organic EL element 111 was formed by the same method as that in the preparation of the organic EL element 110, except that a thin metal line pattern in which lines having a width of 30 μm were arranged with a pitch of 240 μm into the shape of Grid+Cross, was formed as the first lead-out electrode portion by the ink jet printing, in the preparation of the organic EL element 110.

[Preparation of Organic EL Element 112]

An organic EL element 112 was formed by the same method as that in the preparation of the organic EL element 110, except that a thin metal line pattern in which lines having a width of 10 μm were arranged with a pitch of 80 μm into the shape of Grid+Cross, was formed as the first lead-out electrode portion by the ink jet printing, in the preparation of the organic EL element 110.

[Preparation of Organic EL Element 113]

An organic EL element 113 was formed by the same method as that in the preparation of the lead-out electrode of the organic EL element 101, except that Ag thin film layer having a thickness of 17.5 nm was formed by a sputtering method, and then, an ITO film was formed by a sputtering method in a condition where a thickness became 150 nm, and thus, the first lead-out electrode portion formed of an Ag/ITO layer was prepared, in the preparation of the lead-out electrode of the organic EL element 101.

<<Evaluation>>

The following evaluation was performed by using the organic EL elements 101 to 113 prepared as described above.

<Difference in Total Light Transmittance>

Total light transmittances (%) of the organic EL element portion and the first lead-out electrode portion in a range of a light wavelength of 400 nm to 700 nm at the time of non-light emission were measured by using a spectrophotometer (U-3300, manufactured by Hitachi High-Technologies Corporation), according to a method described in JIS K 7361-1:1997 (a test method of a total light transmittance of a plastic-transparent material), and then, a difference therebetween was obtained.

○: The difference in the light transmittances between the light emitting region of the organic EL element and the lead-out electrode portion is less than or equal to ±10%

Δ: The difference in the light transmittances between the light emitting region of the organic EL element and the lead-out electrode portion is greater than ±10% and less than or equal to ±15% x: The difference in the light transmittances between the light emitting region of the organic EL element and the lead-out electrode portion is greater than ±15%

Furthermore, all of the total light transmittances (%) of the organic EL element portions of the organic EL elements 101 to 113 at the time of non-light emission were 65%.

<Voltage Drop>

The first lead-out electrode portion causes a voltage drop due to conductive wire resistance. In the first lead-out electrode portion, the resistance of both ends of the first lead-out electrode was measured by using a low resistance meter 3566 (manufactured by TSURUGA ELECTRIC CORPORATION), and was determined on the basis of the following standard.

○: Less than 2 Ω/square

Δ: Greater than or equal to 2 Ω/square and less than 10 Ω/square x: Greater than or equal to 10 Ω/square <Visibility of Thin Metal Line Pattern>

In a general office environment, it was determined whether or not the thin metal line pattern was seen on the basis of the following standard when a transparent organic EL element was seen through from a distance of 50 cm in a white background (the background is white).

○: The thin metal line pattern is not seen at all

Δ: The thin metal line pattern is slightly seen x: The thin metal line pattern is obviously seen <Polarization Properties of Thin Metal Line Pattern>

In a general office environment, the occurrence of tint or moire in the transmission visual region was visually evaluated by rotating the element when a transparent organic EL element was seen through from a distance of 50 cm in a white background (the background is white), and determination was performed on the basis of the following standard.

○: The transmission light is even

Δ: The transmission light is seen double, and thus, there is slightly uncomfortable feeling x: A transmission visual field is different from a real image, and thus, there is uncomfortable feeling The configurations and the evaluation results of the organic EL elements described above are shown in Table 1. present invention unless the width of the thin metal line, the pitch of the thin metal lines, and the pattern shape are suitably controlled, and the present invention is realized first

TABLE 1

| Organic EL element No. | First lead-out electrode portion Material | Thickness [nm] | Thin metal line pattern Width [μm] | Pitch [μm] | Pattern shape | Evaluation Total light transmittance [%] Organic EL element portion |
|---|---|---|---|---|---|---|
| 101 | MAM | 150 | — | — | — | 65 |
| 102 | ITO | 150 | — | — | — | 65 |
| 103 | Ag thin line + ITO layer | 150 | 50 | 5000 | Line | 65 |
| 104 | Ag thin line + ITO layer | 150 | 50 | 200 | Line | 65 |
| 105 | Ag thin line + ITO layer | 150 | 30 | 120 | Line | 65 |
| 106 | Ag thin line + ITO layer | 150 | 10 | 40 | Line | 65 |
| 107 | Ag thin line + ITO layer | 150 | 50 | 280 | Grid (+) | 65 |
| 108 | Ag thin line + ITO layer | 150 | 30 | 170 | Grid (+) | 65 |
| 109 | Ag thin line + ITO layer | 150 | 10 | 60 | Grid (+) | 65 |
| 110 | Ag thin line + ITO layer | 150 | 50 | 390 | Grid cross (combination of + and x) | 65 |
| 111 | Ag thin line + ITO layer | 150 | 30 | 240 | Grid cross (combination of + and x) | 65 |
| 112 | Ag thin line + ITO layer | 150 | 10 | 80 | Grid cross (combination of + and x) | 65 |
| 113 | Ag thin line + ITO layer | Ag/ITO 17.5 + 150 | — | — | — | 65 |

| Organic EL element No. | Evaluation Total light transmittance [%] First lead-out electrode portion | Difference in total light transmittance | Voltage drop | Visibility | Polarization properties | Reference |
|---|---|---|---|---|---|---|
| 101 | 30 | X | ○ | X | — | Comparative Example |
| 102 | 80 | X | X | X | — | Comparative Example |
| 103 | 40 | X | X | X | Δ | Comparative Example |
| 104 | 60 | ○ | ○ | Δ | Δ | Present invention |
| 105 | 65 | ○ | ○ | ○ | Δ | Present invention |
| 106 | 70 | ○ | ○ | ○ | Δ | Present invention |
| 107 | 60 | ○ | ○ | ○ | ○ | Present invention |
| 108 | 65 | ○ | ○ | ○ | ○ | Present invention |
| 109 | 70 | ○ | ○ | ○ | ○ | Present invention |
| 110 | 60 | ○ | ○ | ○ | ○ | Present invention |
| 111 | 65 | ○ | ○ | ○ | ○ | Present invention |
| 112 | 70 | ○ | ○ | ○ | ○ | Present invention |
| 113 | 65 | ○ | ○ | ○ | ○ | Present invention |

From the results of Table 1, according to the configuration of the present invention, it was possible to realize smooth connection with respect to the transparent organic EL element, which was not capable of being realized in the lead-out electrode using known MAM or ITO of the related art, it was possible to realize transparency without having uncomfortable feeling in visibility by including even the lead-out electrode, and it was possible to prepare the transparent organic EL element having a light transmittance in both of the light emitting unit and a non-light emitting unit.

Further, it is known that even in a case of using the thin metal line pattern, it is not possible to attain the object of the by an optimal configuration of the lead-out electrode for a transparent organic EL element.

It is considered that illumination tiling is capable of being performed in an unlimited length by joining the organic EL elements of the present invention in a vertical direction of the drawings, and thus, there is a possibility that the usage and the application of the transparent organic EL element are widened.

Example 2

[Preparation of Organic EL Element 201]

In the preparation of the organic EL element 101, which is a comparative example of Example 1, a resin substrate described below was used instead of the transparent glass substrate as the support substrate of the element.

(Resin Substrate)

A clear hard coat polyethylene terephthalate (PET/CHC) film (G1SBF, manufactured by Kimoto Co., Ltd., a thickness of 125 μm, and a refractive index of 1.59, and hereinafter, referred to as a CHC-PET film) was prepared as the resin substrate.

(Gas Barrier Layer)

Next, a gas barrier layer was prepared on a front surface of the resin substrate described above (a surface on a side where a conductive layer was formed).

A resin base material was set in a discharge plasma chemical gas phase growth device (a plasma CVD device, Precision5000, manufactured by Applied Materials, Inc.), and was continuously transported in a roll to roll manner. Next, a magnetic field was applied between film formation rollers, and power was supplied to each of the film formation rollers, and thus, plasma was generated between the film formation rollers, and a discharge region was formed. Next, gas of hexamethyl disiloxane (HMDSO), which is raw material gas, and oxygen gas (also functions as discharge gas), which is reactive gas, was supplied to the formed discharge region mixed from a gas supply line as film formation gas, and in the following condition, the gas barrier layer having a layer thickness of 120 nm was formed.

(Film Formation Condition)

Supplied Amount of Raw Material Gas (Hexamethyl Disiloxane, HMDSO): 50 sccm (Standard Cubic Centimeter per Minute)

Supplied Amount of Reactive Gas ($O^2$): 500 sccm

Vacuum Degree in Vacuum Chamber: 3 Pa

Applied Power from Plasma Generating Power Source: 0.8 kW

Frequency of Plasma Generating Power Source: 70 kHz

Film Transport Velocity: 0.8 m/min

A positive electrode (ITO), a hole injecting layer to an electron injecting layer, and a negative electrode (Ag) were formed by using the prepared PET film with the gas barrier layer as a substrate, as with the organic EL element 4.

A thin metal line and an ITO layer were formed as the first lead-out electrode portion, and Molybdenum (Mo)/Aluminum (Al)/Molybdenum (Mo) (MAM) was formed such that a sectional shape became a trapezoidal shape, as the second lead-out electrode portion, and the electrode portions were connected to each other.

A thermal curable liquid adhesive agent (Epoxy-Based Photocurable Adhesive Agent: Luxtrack LC0629B, manufactured by TOAGOSEI CO., LTD.) was applied onto the gas barrier layer side of the PET film with the gas barrier layer, prepared as described above to have a thickness of 30 μm, as the sealing substrate, and as illustrated in FIG. 1, the second lead-out electrode portion and the resin substrate of the element cohered to each other, UV light was emitted from the resin substrate side, and curing and sealing were performed, and thus, an organic EL element 201 was obtained.

[Organic EL Elements 202 to 213]

Organic EL elements 202 to 213 were respectively prepared by the same method as that in the preparation of the organic EL elements 102 and 103, which are comparative examples of Example 1 and the organic EL elements 104 to 113 according to the present invention, except that the PET film with the gas barrier layer described above was used as the resin substrate and the sealing substrate.

A difference in light transmittances, a voltage drop, visibility, and polarization properties were evaluated by using the prepared organic EL elements 201 to 203, which are comparative examples, and the organic EL elements 204 to 213 according to the present invention, as with Example 1, and thus, Example 1 was reproduced, and it was known that in the organic EL elements 204 to 213 according to the present invention, it was possible to obtain a transparent organic electroluminescence element in which durability was excellent, a transparent lead-out electrode of low resistance was provided, and there was no uncomfortable feeling in visibility of the entire element. Further, it was known that the resin substrate was applied to the support substrate and the sealing substrate, and thus, it was possible to obtain a flexible transparent organic EL element.

Example 3

An organic EL element was prepared by the same method as that in the organic EL element 212 of Example 2, except that a conductive polymer layer described below was formed instead of the ITO layer, as the conductive layer combined with the thin metal line, and evaluation was performed, and thus, Example 2 was reproduced, and it was known that it was possible to obtain a transparent organic electroluminescence element in which durability was excellent, a transparent lead-out electrode of low resistance was provided, and there was no uncomfortable feeling in visibility of the entire element.

[Conductive Polymer]

A conductive polymer (PEDOT/PSS)-containing liquid was subjected to coating and patterning, and thus, the conductive polymer layer was prepared.

A conductive polymer-containing liquid described below was printed on the resin base material on which the thin metal line pattern described above was formed, by an ink jet method, and then, was subjected to natural drying at a room temperature, and thus, the conductive polymer layer having a thickness of 500 nm was formed.

The conductive polymer-containing liquid was adjusted by mixing 0.40 g of a water-soluble binder resin aqueous solution (an aqueous solution having a solid content of 20%), 1.90 g of PEDOT-PSS CLEVIOS PH750 (a solid content of 1.03%, manufactured by Heraeus Holding GmbH), and 0.10 g of dimethyl sulfoxide together. Furthermore, a water-soluble binder resin was dissolved in pure water, and thus, the water-soluble binder resin aqueous solution having a solid content of 20% was prepared.

In addition, in the water-soluble binder resin, 200 ml of tetrahydrofuran (THF) was added to a three-neck flask of 300 ml, and was subjected to heating and refluxing for 10 minutes, and then, was cooled at a room temperature under nitrogen. Next, 2-hydroxy ethyl acrylate (10.0 g, 86.2 mmol, a molecular weight of 116.12) and azobisbutyronitrile (AIBN) (2.8 g, 17.2 mmol, a molecular weight of 164.11) were added thereto, and were subjected to heating and refluxing for 5 hours. Next, the mixture was cooled at a room temperature, and then, a reaction solution was dropped into 2000 ml of methyl ethyl ketone (MEK), and was stirred for 1 hour. Next, the MEK solution was subjected to decantation, and then, was washed with 100 ml of MEK three times, and was moved to a flask of 100 ml by dissolving a polymer with THF. Next, the THF solution was distilled by a rotary evaporator under a reduced pressure, and then, was dried at 50° C. for 3 hours under a reduced pressure. As a result thereof, 9.0 g of a water-soluble binder resin having a number average molecular weight of 22100 and a molecular weight distribution of 1.42 was (a yield of 90%) was obtained.

Here, the structure and the molecular weight of the water-soluble binder resin were respectively measured by 1H-NMR (400 MHz, manufactured by JEOL Ltd.) and GPC (Waters2695, manufactured by Nihon Waters K.K.).

(GPC Measurement Condition)
Device: Waters 2695 (Separations Module)
Detector: Waters 2414 (Refractive Index Detector)
Column: Shodex Asahipak GF-7M HQ
Eluent: Dimethyl Formamide (20 mM LiBr)
Flow Rate: 1.0 ml/min
Temperature: 40° C.

INDUSTRIAL APPLICABILITY

The transparent organic electroluminescence element of the present invention is particularly suitable for an organic electroluminescence element in which advanced transparency is required, since durability is excellent, a transparent lead-out electrode of low resistance is provided, and there is no uncomfortable feeling in visibility of the entire element.

REFERENCE SIGNS LIST

EL transparent organic EL element
1 transparent base material
2 organic functional layer
3 light emitting region
4 sealing region
5 first lead-out electrode portion
6 second lead-out electrode portion
7 positive electrode
8 negative electrode
9 optical adjustment layer
30 transparent organic EL element
31 transparent base material
32 positive electrode
33 first carrier functional layer group
34 light emitting layer
35 second carrier functional layer group
36 negative electrode
37 adhesive agent
38 sealing material
h light emission center
L, L' light

The invention claimed is:

1. A transparent organic electroluminescence element, comprising:
   at least an organic electroluminescence element portion and a lead-out electrode portion, in which two-sided light emission is capable of being performed,
   wherein a total light transmittance (%) of the lead-out electrode portion in a visible light range is in a range of 90% to 110% of a total light transmittance (%) of the organic electroluminescence element portion in a visible light range, and
   each total light transmittance is measured with a light in the visible light range of a light wavelength of 400 to 700 nm in accordance with JIS K 7361-1:1997 at the time of non-light emission from the transparent organic electroluminescence element.

2. The transparent organic electroluminescence element according to claim 1,
   wherein a surface resistance value of the lead-out electrode portion is less than 3 Ω/ square.

3. The transparent organic electroluminescence element according to claim 1,
   wherein the organic electroluminescence element portion is provided on a film base material.

4. The transparent organic electroluminescence element according to claim 1,
   wherein the lead-out electrode portion includes at least a metal line.

5. The transparent organic electroluminescence element according to claim 1,
   wherein the lead-out electrode portion includes at least a metal line and a metal oxide layer.

6. The transparent organic electroluminescence element according to claim 4,
   wherein a line width of the metal line is more than or equal to 10 μm and less than or equal to 30 μm.

7. The transparent organic electroluminescence element according to claim 4,
   wherein a pattern shape of the metal line has a polarization suppressing structure selected from a grid shape or a honeycomb shape.

8. The transparent organic electroluminescence element according to claim 1,
   wherein the lead-out electrode portion exists only in a sealing region, and the lead-out electrode portion is connected to a second lead-out electrode having a planar structure in a pass portion inside and outside the sealing region.

9. The transparent organic electroluminescence element according to claim 2,
   wherein the organic electroluminescence element portion is provided on a film base material.

10. The transparent organic electroluminescence element according to claim 2,
    wherein the lead-out electrode portion includes at least a metal line.

11. The transparent organic electroluminescence element according to claim 2,
    wherein the lead-out electrode portion includes at least a metal line and a metal oxide layer.

12. The transparent organic electroluminescence element according to claim 2,
    wherein the lead-out electrode portion exists only in a sealing region, and the lead-out electrode portion is connected to a second lead-out electrode having a planar structure in a pass portion inside and outside the sealing region.

13. The transparent organic electroluminescence element according to claim 3,
    wherein the lead-out electrode portion includes at least a metal line.

14. The transparent organic electroluminescence element according to claim 3,
    wherein the lead-out electrode portion includes at least a metal line and a metal oxide layer.

15. The transparent organic electroluminescence element according to claim 3,
    wherein the lead-out electrode portion exists only in a sealing region, and the lead-out electrode portion is connected to a second lead-out electrode having a planar structure in a pass portion inside and outside the sealing region.

16. The transparent organic electroluminescence element according to claim 4, wherein the lead-out electrode portion includes at least a metal line and a metal oxide layer.

17. The transparent organic electroluminescence element according to claim 4,
wherein the lead-out electrode portion exists only in a sealing region, and the lead-out electrode portion is connected to a second lead-out electrode having a planar structure in a pass portion inside and outside the sealing region.

18. The transparent organic electroluminescence element according to claim 5,
wherein a line width of the metal line is more than or equal to 10 μm and less than or equal to 30 μm.

19. The transparent organic electroluminescence element according to claim 5,
wherein a pattern shape of the metal line has a polarization suppressing structure.

20. The transparent organic electroluminescence element according to claim 5,
wherein the lead-out electrode portion exists only in a sealing region, and the lead-out electrode portion is connected to a second lead-out electrode having a planar structure in a pass portion inside and outside the sealing region.

* * * * *